United States Patent
Ushirogouchi et al.

(10) Patent No.: US 6,440,636 B1
(45) Date of Patent: Aug. 27, 2002

(54) POLYMERIC COMPOUND AND RESIN COMPOSITION FOR PHOTORESIST

(75) Inventors: Toru Ushirogouchi, Yokohama; Takeshi Okino, Tokyo; Koji Asakawa, Kawasaki; Naomi Shida, Tokyo; Yoshinori Funaki, Himeji; Kiyoharu Tsutsumi, Himeji; Akira Takaragi, Himeji; Keizo Inoue, Himeji, all of (JP)

(73) Assignees: Kabushiki Kaisha Toshiba, Kanagawa-ken; Daicel Chemical Industries, LTD, Osaka, both of (JP)

(*) Notice: Subject to any disclaimer, the term of this patent is extended or adjusted under 35 U.S.C. 154(b) by 0 days.

(21) Appl. No.: 09/703,677

(22) Filed: Nov. 2, 2000

(51) Int. Cl.$^7$ .............................................. G03F 7/004
(52) U.S. Cl. .................... 430/270.1; 526/319; 526/320; 526/328
(58) Field of Search ................... 430/270.1; 526/281, 526/319, 320, 328

(56) References Cited

U.S. PATENT DOCUMENTS

| | | | |
|---|---|---|---|
| 5,968,713 A | 10/1999 | Nozaki et al. | |
| 6,303,266 B1 | * 10/2001 | Okino et al. | 430/270.1 |

FOREIGN PATENT DOCUMENTS

| | | |
|---|---|---|
| JP | 07252324 | 3/1995 |
| JP | 09073173 | 3/1997 |
| JP | 09090637 | 4/1997 |
| JP | 10319595 | 4/1998 |
| JP | 10274852 | 10/1998 |
| JP | 11012326 | 1/1999 |
| JP | 11109632 | 4/1999 |
| JP | 11119434 | 4/1999 |
| JP | 2000-194135 | * 7/2000 |
| JP | 2000-214588 | * 8/2000 |

OTHER PUBLICATIONS

Iwasa et al., SPIE, vol. 3049, pp. 126–134.

* cited by examiner

Primary Examiner—Rosemary Ashton
(74) Attorney, Agent, or Firm—Birch Stewart Kolasch & Birch LLP

(57) ABSTRACT

A polymeric compound includes at least one monomeric unit of the following formula (I):

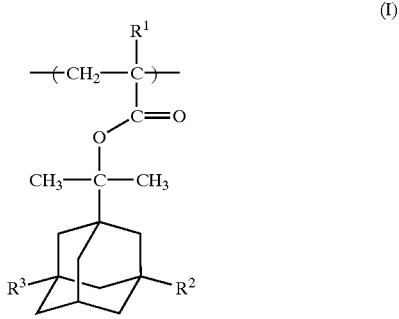

(I)

wherein $R^1$ is a hydrogen atom or a methyl group; and each of $R^2$ and $R^3$ is independently a hydrogen atom or a hydroxyl group. The polymeric compound may include the monomeric unit and at least one monomeric unit selected from monomeric units represented by the following formulae (IIa) and (IIb):

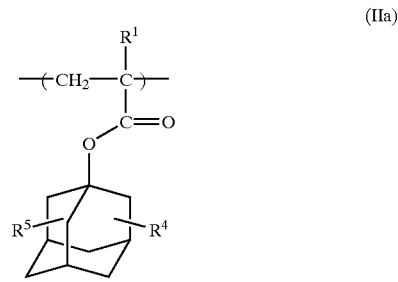

(IIa)

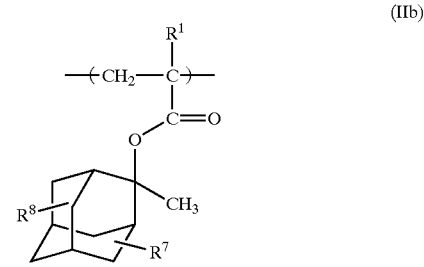

(IIb)

wherein $R^1$ is a hydrogen atom or a methyl group; each of $R^4$ and $R^5$ is, for example, a hydrogen atom, a hydroxyl group, an oxo group, or a carboxyl group, wherein $R^4$ and $R^5$ are not concurrently hydrogen atoms; and each of $R^7$ and $R^8$ is independently a hydrogen atom, a hydroxyl group, or an oxo group. The polymeric compound have a high etching resistance in addition to satisfactory transparency, alkali-solubility, and adhesion.

7 Claims, No Drawings

POLYMERIC COMPOUND AND RESIN COMPOSITION FOR PHOTORESIST

BACKGROUND OF THE INVENTION

1. Field of the Invention

The present invention relates to a polymeric compound (polymer) which is useful as a photoresist resin for use in, for example, micromachining of semiconductors, and to a photoresist resin composition containing the polymeric compound.

2. Description of the Related Art

Positive photoresists for use in manufacturing processes of semiconductors must concurrently have different characteristics such as a characteristic that an exposed portion is made soluble in alkali by the application of light, adhesion to silicon wafers, plasma-etching resistance, and transparency to light used. The positive photoresists are generally used as a solution containing a base compound polymer, a lightact-ivatable acid generator, and several types of additives for controlling the above characteristics. It is very important for the main compound polymer to have the above individual characteristics in balance to prepare an appropriate resist according to its use.

The wavelength of a light source for exposure in lithography for use in semiconductor manufacturing becomes shorter and shorter in recent years, and ArF excimer laser with a wavelength of 193 nm is promising as a next-generation light source. The use of a unit containing an alicyclic hydrocarbon skeleton has been proposed as a monomeric unit for a resist polymer for use in the ArF excimer laser exposure system (e.g., Japanese Patent No. 2776273). Such an alicyclic hydrocarbon skeleton is highly transparent with respect to light with the aforementioned wavelength and is resistant against etching. The use of a polymer having an adamantane skeleton as a resist polymer is also known, which adamantane skeleton exhibits an especially high etching resistance among alicyclic hydrocarbon skeletons. However, such alicyclic hydrocarbon skeletons are highly hydrophobic and have therefore low adhesion with respect to substrates, although they have a high etching resistance as mentioned above. To improve this disadvantage, the aforementioned Japanese patent therefore proposes a copolymer containing a highly hydrophilic monomeric unit (adhesion-imparting monomeric unit) having, for example, a carboxyl group or a lactone ring. However, the monomeric unit is not resistant to etching, and the etching resistant of the overall polymer becomes insufficient when the polymer contains a sufficient amount of the monomeric unit to satisfy the required adhesion.

Separately, Japanese Unexamined Patent Application Publication No. 11-109632 has a try at imparting hydrophilicity to an adamantane skeleton by introducing a hydroxyl group to the adamantane skeleton. However, the polymer proposed in the publication uses t-butyl (meth)acrylate as a monomeric unit (alkali-soluble monomeric unit) which becomes soluble in alkali by action of an acid generated by light irradiation, and the etching resistance of the overall polymer is still insufficient.

Attempts have been made to use a monomeric unit having an adamantane skeleton itself as an alkali-soluble monomeric unit (e.g., Japanese Unexamined Patent Application Publications No. 9-73173, No. 9-90637, No. 10-274852, No. 10-319595, No. 11-12326, and No. 11-119434). However, monomers lacking etching resistance are used as the adhesion-imparting monomeric units in these polymers, and the overall resulting polymers are still insufficient in etching resistance.

SUMMARY OF THE INVENTION

Accordingly, it is an object of the present invention to provide a polymeric compound having not only satisfactory transparency, alkali-solubility, and adhesion but also a high etching resistance, as well as to provide a photoresist resin composition containing the polymeric compound.

After intensive investigations, the present inventors found that when a polymer containing a monomeric unit having an adamantane skeleton with a specific structure is used as a photoresist resin, the resulting photoresist resin has a satisfactory etching resistance, in addition to excellent transparency, alkali-solubility, and adhesion. The present invention has been accomplished based on these findings.

Specifically, the present invention provides, in an aspect, a polymeric compound which includes at least one monomeric unit represented by the following formula (I):

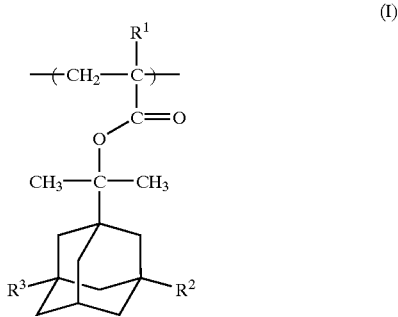

wherein $R^1$ is a hydrogen atom or a methyl group; and each of $R^2$ and $R^3$ is independently a hydrogen atom or a hydroxyl group.

The polymeric compound may further include at least one monomeric unit selected from monomeric units represented by the following formula (IIa) and (IIb):

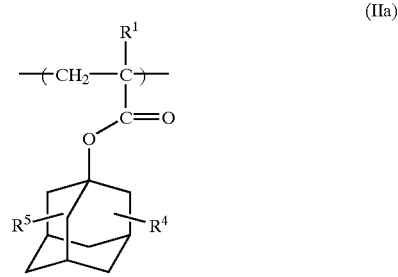

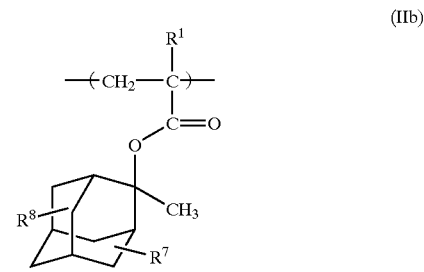

wherein $R^1$ is a hydrogen atom or a methyl group; each of $R^4$ and $R^5$ is independently a hydrogen atom, a hydroxyl group, an oxo group, a carboxyl group, or a —$COOR^6$ group, wherein $R^6$ is a t-butyl group, a 2-tetrahydrofuranyl group, a 2-tetrahydropyranyl group or an 2-oxepanyl group, and wherein $R^4$ and $R^5$ are not concurrently hydrogen atoms; and each of $R^7$ and $R^8$ is independently a hydrogen atom, a hydroxyl group, or an oxo group.

Preferably, the polymeric compound may further comprise, in addition to the above monomeric units, at least one monomeric unit selected from a monomeric unit represented by the following formula (III):

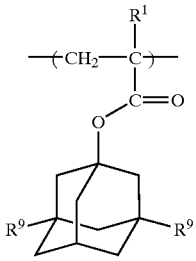

(III)

wherein each of $R^1$ and $R^9$ is independently a hydrogen atom or a methyl group; a monomeric unit represented by the following formula (IV):

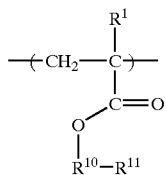

(IV)

wherein $R^{10}$ is a tricyclo[5.2.1.0$^{2,6}$]decylmethyl group, a tetracyclo[4.4.0.1$^{2,5}$.1$^{7,10}$]dodecylmethyl group, a norbornyl group, an isobornyl group, or a 2-norbornylmethyl group, $R^{11}$ is a substituent of $R^{10}$ selected from a hydrogen atom, a hydroxyl group, a hydroxymethyl group, a carboxyl group, and a —COOR$^{12}$ group, wherein $R^2$ is a t-butyl group, a 2-tetrahydrofuranyl group, a 2-tetrahydropyranyl group, or an 2-oxepanyl group; and $R^1$ has the same meaning as defined above; a monomeric unit represented by the following formula (Va) or (Vb):

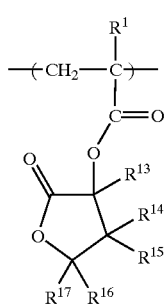

(Va)

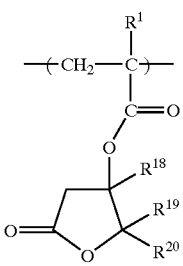

(Vb)

wherein each of $R^{13}$, $R^{14}$, $R^{15}$, $R^{16}$, $R^{17}$, $R^{18}$, $R^{19}$, and $R^{20}$ is independently a hydrogen atom or a methyl group, and $R^1$ has the same meaning as defined above; a monomeric unit represented by the following formula (VI):

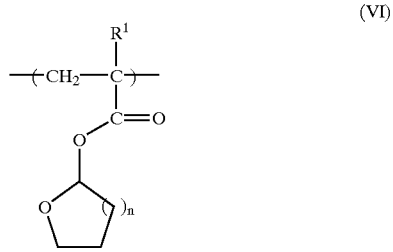

(VI)

wherein n denotes an integer of 1 to 3; and $R^1$ has the same meaning as defined above; and a monomeric unit represented by the following formula (VII):

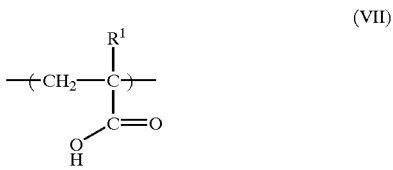

(VII)

wherein $R^1$ has the same meaning as defined above.

Monomeric units each having an adamantane skeleton may occupy, for example, 50% to 100% by weight, and preferably 70% to 100% by weight of overall monomeric units constituting the polymer.

The polymeric compound can be used as a photoresist resin.

In another aspect, the present invention provides a photoresist resin composition which includes the polymeric compound and a light-activatable acid generator.

The terms "acrylic(acryl)" and "methacrylic(methacryl)" may be generically referred to as "(meth)acrylic" or "(meth) acryl" herein.

DESCRIPTION OF THE PREFERRED EMBODIMENTS

The invented polymeric compound comprises at least one monomeric unit represented by the formula (I) (hereinafter referred to as "monomeric unit 1") as a structural unit constituting a polymer molecule.

In the monomeric unit of the formula (I), a moiety containing an adamantane skeleton is eliminated from a carboxylic acid moiety combined with a principal chain by action of an acid to thereby yield a free carboxyl group. The monomeric unit 1 therefore acts as an alkali-soluble unit which becomes soluble in development using an alkali. The monomeric unit has the adamantane skeleton and therefore has a satisfactory transparency and a very high etching resistance. Of the monomeric units of the formula (1), monomeric units in which at least one (preferably both) of $R^2$ and $R^3$ is a hydroxyl group are highly hydrophilic and exhibit adhesion activity. Accordingly, the polymeric compound can exhibit a satisfactory adhesion activity by appropriately incorporating these monomeric units or other hydrophilic monomeric units. The invented polymeric compound can therefore be advantageously used as a photoresist resin.

In a preferred embodiment of the present invention, the polymeric compound comprises the monomer unit 1 and at least one monomeric unit (hereinafter referred to as "monomeric unit 2") selected from monomeric units represented by the formula (IIa) and (IIb).

In the formula (IIa), $R^4$ and $R^5$ are groups each combined with a carbon atom constituting an adamantane ring. When each of these groups is a hydroxyl group, a carboxyl group, or a —COOR$^6$ group, it is generally combined with the adamantane ring at a bridgehead position. In the formula (IIb), R$^7$ and R$^8$ are groups each combined with a carbon atom constituting an adamantane ring, and when each of these groups is a hydroxyl group, it is generally combined with the adamantane ring at a bridgehead position.

The monomeric unit 2 has a high etching resistance owing to the adamantane skeleton. Of these monomeric units 2, monomeric units in which a hydrophilic group (hydroxyl group, carboxyl group, or oxo group) is combined with the adamantane skeleton can serve as adhesion-imparting units to improve adhesion to substrates. Of the monomeric units of the formula (IIa), monomeric units in which at least one of R$^4$ and R$^5$ is a —COOR$^6$ group, as well as the monomeric units of the formula (IIb), yield a free carboxyl group by action of an acid to thereby have an alkali-soluble activity. Separately, monomeric units of the formula (IIa) in which R$^4$ is a hydrogen atom and R$^5$ is a —COOR$^6$ group, and monomeric units of the formula (IIb) in which R$^7$ and R$^8$ are hydrogen atoms have no adhesion activity but have an alkali-soluble activity as above. Accordingly, a combination use of these monomeric units with monomeric units of the formula (I) in which at least one (preferably both) of R$^2$ and R$^3$ is a hydroxyl group can yield a polymeric compound having an alkali-soluble activity and an adhesion activity in good valance.

Such polymeric compounds having both the monomeric unit 1 and the monomeric unit 2 exhibit high etching resistance and have alkali solubility, adhesion to substrate, plasma-etching resistance, and transparency in very good valance, owing to both adamantane skeletons of the two units. In these polymeric compounds, the ratio of the monomeric unit 1 to the monomeric unit 2 is such that the former/the later (by mole) is, for example, about 1/99 to 99/1, preferably about 5/95 to 80/20, and more preferably about 15/85 to 65/35.

The invented polymeric compound may further comprise at lest one monomeric unit (hereinafter referred to as "monomeric unit 3") selected from a monomeric unit represented by the formula (III) and having an adamantane skeleton (having neither adhesion activity nor alkali-soluble activity), a monomeric unit represented by the formula (IV) and having a bridged alicyclic hydrocarbon skeleton other than adamantane, a monomeric unit represented by the formula (Va) or (Vb) and having a lactone skeleton, an acetal monomeric unit represented by the formula (VI), and a monomeric unit represented-by the formula (VII) and having a carboxyl group.

A polymer composed of only a structural unit having an adamantane skeleton has a scarce entanglement in the molecule and is therefore relatively brittle. The incorporation of any of the monomeric units of the formulae (IV) to (VII) in the polymer can improve the brittleness. In addition, the monomeric units of the formula (III) and (IV) have a high etching resistance, the monomeric units of the formula (Va) and (Vb) have adhesion-imparting activity, and the monomeric units of the formula (Vb) and (VI) have alkali-soluble activity. The characteristics of the polymer necessary as a resist resin can be finely adjusted by appropriately incorporating these monomeric units into the polymer.

In the polymeric compound containing the monomeric unit 3, the total content of the monomeric unit 3 is, for example, about 1% to 50% by mole, and preferably about 5% to 40% by mole based on the total moles of the overall monomeric units constituting the polymer.

Typically preferred combinations of the monomeric units in the invented polymeric compound are as follows.

(1) A combination of a monomeric unit of the formula (I) in which R$^2$ and R$^3$ are hydrogen atoms with a monomeric unit of the formula (I) in which at least one of R$^2$ and R$^3$ is a hydroxyl group (2) A combination of a monomeric unit of the formula (I) with a monomeric unit of the formula (IIa)

(3) A combination of a monomeric unit of the formula (I) in which at least one of R$^2$ and R$^3$ is a hydroxyl group with a monomeric unit of the formula (IIa) in which R$^4$ or R$^5$ is a —COOR$^6$ group (4) A combination of a monomeric unit of the formula (I) with a monomeric unit of the formula (IIb) in which at least one of R$^7$ and R$^8$ is a hydroxyl group (especially, a monomeric unit of the formula (IIb) in which R$^7$=R$^8$=OH)

(5) A combination of a monomeric unit of the formula (I) in which at least one of R$^2$ and R$^3$ is a hydroxyl group with a monomeric unit of the formula (IIb)

(6) A combination of a monomeric unit of the formula (I) and a monomeric unit of the formula (Va) (e.g., a monomeric unit of the formula (Va) in which at least one of R$^{13}$ to R$^{17}$ is a methyl group)

(7) A combination of a monomeric unit of the formula (I) with a monomeric unit of the formula (Vb) (e.g., a monomeric unit of the formula (Vb) in which at least one of R$^{18}$ to R$^{20}$ is a methyl group, and especially a monomeric unit of the formula (Vb) in which R$^{19}$ and R$^{20}$ are methyl groups)

(8) A combination of a monomeric unit of the formula (I) with a monomeric unit of the formula (VI)

(9) A combination of a monomeric unit of the formula (I) with a monomeric unit of the formula (IIa) and a monomeric unit of the formula (Va)

(10) A combination of the monomeric unit of the formula (I) with a monomeric unit of the formula (IIa) and a monomeric unit of the formula (Vb)

(11) A combination of a monomeric unit of the formula (I) with a monomeric unit of the formula (IIa) and a monomeric unit of the formula (VI).

In the invented polymeric compound, the total content of monomeric units each having an adamantane skeleton [monomeric units of the formula (I), (IIa), (IIb), and (III), particularly, of the formula (I), (IIa), and (IIb)] is, for example, about 50% to 100% by weight, and preferably about 70% to 100% by weight based on the total weight of overall monomeric units constituting the polymer. Within the above range, the resulting polymeric compound exhibits a typically satisfactory etching resistance.

The invented polymeric compound has a weight average molecular weight (Mw) of, for example, about 5000 to 50000, and preferably about 7000 to 20000, whose molecular weight distribution (Mw/Mn) is for example about 1.8 to 3.0. The symbol "Mn" indicates a number average molecular weight (in terms of polystyrene).

Each of the monomeric units of the formulae (I) to (VII) can be prepared by subjecting a corresponding (meth)acrylic ester as a (co-)monomer to polymerization. The polymerization can be performed through solution polymerization, melting polymerization or other conventional techniques for use in manufacture of acrylic polymers.

[Monomeric Unit of Formula (I)]

Monomers corresponding to the monomeric units of the formula (I) are represented by the following formula (1):

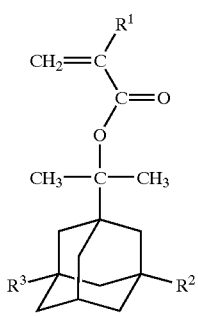

(1)

wherein $R^1$, $R^2$ and $R^3$ have the same meanings as defined above.

Typical examples of the monomers are the following compounds.

[1-1] 1-(1-(Meth)acryloyloxy-1-methylethyl)adamantane ($R^1$=H or $CH_3$, $R^2$=$R^3$=H)

[1-2] 1-Hydroxy-3-(1-(meth)acryloyloxy-1-methylethyl) adamantane ($R^1$=H or $CH_3$, $R^2$=OH, $R^3$=H)

[1-3] 1,3-Dihydroxy-5-(1-(meth)acryloyloxy-1-methylethyl)adamantane ($R^1$=H or $CH_3$, $R^2$=$R^3$=OH)

The compounds of the formula (1) can be prepared, for example, according to the following reaction process chart:

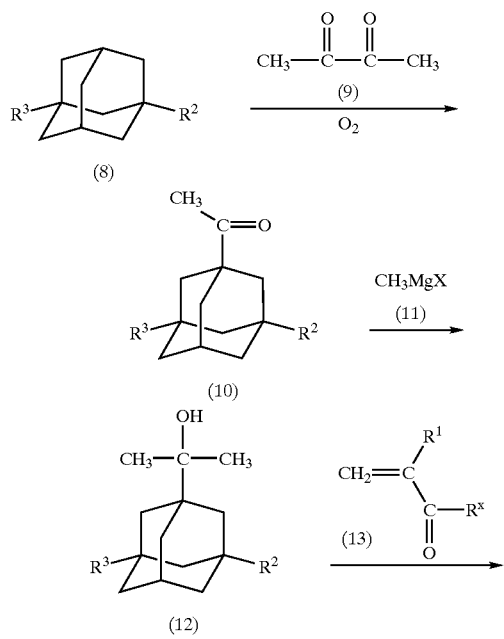

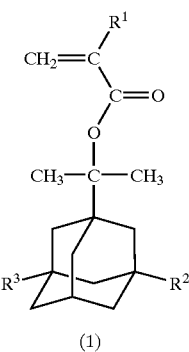

(1)

wherein X is a halogen atom, $R^x$ is a halogen atom, a hydroxyl group, an alkoxy group, or an alkenyloxy group, and $R^1$, $R^2$, and $R^3$ have the same meanings as defined above.

Of adamantane derivatives (8) in the reaction process chart, a compound in which at least one of $R^2$ and $R^3$ is a hydroxyl group can be obtained by introducing a hydroxyl group into an adamantane ring. For example, the hydroxyl group can be introduced into the adamantane ring by allowing adamantane to come in contact with oxygen in the presence of a N-hydroxyimide catalyst such as N-hydroxyphthalimide, and where necessary a metallic promoter (co-catalyst) such as a cobalt compound (e.g., cobalt acetate or acetylacetonatocobalt). In this process, the amount of the N-hydroxyimide catalyst is, for example, about 0.0001 to 1 mole, and preferably about 0.001 to 0.5 mole relative to 1 mole of adamantane. The amount of the metallic promoter is, for example, about 0.0001 to 0.7 mole, and preferably about 0.001 to 0.5 mole relative to 1 mole of adamantane. The oxygen is often used in excess amounts relative to adamantane. The reaction is performed in a solvent at a temperature of about 0° C. to 200° C., and preferably of about 30° C. to 150° C. at atmospheric pressure or under a pressure (under a load). Such solvents include, for example, acetic acid and other organic acids, acetonitrile and other nitrites, and dichloroethane and other halogenated hydrocarbons. Plural hydroxyl groups can be introduced into the adamantane ring by appropriately selecting reaction conditions.

A reaction of the adamantane derivative (8) with a 1,2-dicarbonyl compound (biacetyl) (9) and oxygen can be performed in the presence of a metallic compound such as a cobalt compound (e.g., cobalt acetate or acetylacetonatocobalt) and/or a N-hydroxyimide catalyst such as N-hydroxyphthalimide. The amount of the 1,2-dicarbonyl compound (9) is about 1 mole or more (e.g., 1 to 50 moles), preferably about 1.5 to 20 moles, and more preferably about 3 to 10 moles, relative to 1 mole of the adamantane derivative (8). The proportion of the metallic compound is, for example, about 0.0001 to 0.1 mole relative to 1 mole of the adamantane derivative (8). The proportion of the N-hydroxyimide catalyst is, for example, about 0.001 to 0.7 mole relative to 1 mole of the adamantane derivative (8). The oxygen is often used in excess amounts relative to the adamantane derivative (8). The reaction is generally performed in an organic solvent. Such organic solvents include, but are not limited to, acetic acid and other organic acids, benzonitrile and other nitriles, trifluoromethylbenzene and other halogenated hydrocarbons. The reaction is conducted at a temperature of, for example, about 30° C. to 250° C., and preferably about 40° C. to 200° C. at atmospheric pressure or under a pressure (under a load).

A reaction between the resulting acyladamantane derivative (10) and a Grignard reagent (11) can be performed according to a conventional Grignard reaction. The amount of the Grignard reagent (11) is, for example, about 0.7 to 3 moles, and preferably about 0.9 to 1.5 moles relative to 1 mole of the acyladamantane derivative (10). When the acyladamantane derivative (10) has hydroxyl group(s) on the adamantane ring, the amount of the Grignard reagent should be increased depending on the number of the hydroxyl group(s). The reaction is carried out in a solvent such as diethyl ether, tetrahydrofuran, or other ethers. A reaction temperature is, for example, about 0° C. to 150° C., and preferably about 20° C. to 100° C.

A reaction (esterification reaction) of the above-prepared adamantanemethanol derivative (12) with a (meth)acrylic acid or its derivative (13) can be performed by a conventional technique using an acid catalyst or an transesterification catalyst. Advantageously, the compounds of the formula (1) can be efficiently prepared under mild conditions by subjecting the adamantanemethanol derivative (12) and an alkenyl (meth)acrylate such as vinyl (meth)acrylate or 2-propenyl (meth)acrylate to a reaction (transesterification reaction) in the presence of a catalyst comprising a compound of Group 3 element of the Periodic Table of Elements. Such catalysts include samarium acetate, samarium trifluoromethanesulfonate, samarium complexes, and other samarium compounds. In this case, the amount of the alkenyl (meth)acrylate is, for example, about 0.8 to 5 moles, and preferably about 1 to 1.5 moles, relative to 1 mole of the adamantanemethanol derivative (12). The amount of the catalyst comprising a compound of Group 3 element of the Periodic Table of Elements is, for example, about 0.001 to 1 mole, and preferably about 0.01 to 0.25 mole, relative to 1 mole of the adamantanemethanol derivative (12). The reaction is performed in an inert solvent at a temperature of about 0° C. to 150° C., and preferably about 25° C. to 120° C.

Alternatively, the compound of the formula (1) can be obtained, for example, according to the following reaction process chart:

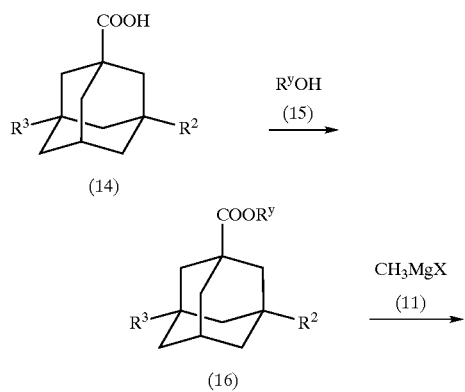

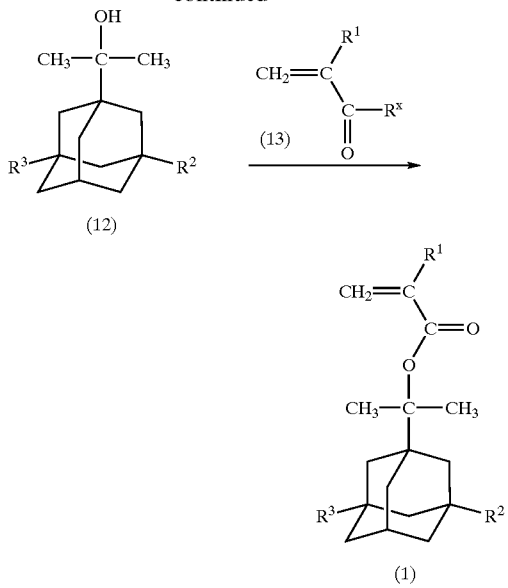

wherein $R^y$ is a hydrocarbon group; and X, $R^1$, $R^2$, $R^3$, and $R^x$ have the same meanings as defined above.

Hydrocarbon groups in $R^y$ include, but are not limited to, methyl, ethyl, propyl, isopropyl, and other $C_1$–$C_6$ aliphatic hydrocarbon groups; and phenyl group.

An adamantanecarboxylic acid derivative (14) for use as a material in the reaction process chart can be prepared by introducing a carboxyl group into an adamantane ring of an adamantane compound. For example, a carboxyl group can be introduced into a adamantane ring of an adamantane compound by allowing the adamantane compound to come in contact with carbon monoxide and oxygen in the presence of a N-hydroxyimide catalyst such as N-hydroxyphthalimide, and where necessary a metallic promoter (metallic co-catalyst) such as a cobalt compound (e.g., cobalt acetate or acetylacetonatocobalt). In the carboxylation reaction, the amount of the N-hydroxyimide catalyst is, for example, about 0.0001 to 1 mole, and preferably about 0.001 to 0.5 mole, relative to 1 mole of the adamantane compound. The proportion of the metallic promoter is, for example, about 0.0001 to 0.7 mole, and preferably about 0.001 to 0.5 mole, relative to 1 mole of the adamantane compound. The amounts of carbon monoxide and oxygen are 1 mole or more and 0.5 mole or more, respectively, relative to 1 mole of the adamantane compound. The ratio of carbon monoxide to oxygen is, for example, such that the former/the latter (by mole) is about 1/99 to 99/1, and preferably about 50/50 to 95/5. The carboxylation reaction is performed in a solvent at a temperature of about 0° C. to 200° C., and preferably about 10° C. to 150° C. at atmospheric pressure or under a pressure (under a load). Such solvents include, for example, acetic acid and other organic acids, acetonitrile and other nitriles, and dichloroethane and other halogenated hydrocarbons. Plural carboxyl groups can be introduced into the adamantane ring by appropriately selecting reaction conditions.

A reaction of an adamantanecarboxylic acid derivative (14) with a hydroxy compound (15) can be performed, for example, according to a conventional esterification technique using an acid catalyst.

A reaction of an adamantanecarboxylic ester of the formula (16) with a Grignard reagent (11) is usually preformed in an inert solvent such as diethyl ether, tetrahydrofuran, or other ethers. A reaction temperature is, for example, about 0° C. to 100° C., and preferably about 10° C. to 40° C. The proportion of the Ginger reagent (11) is, for example, about 2 to 4 equivalents relative to the adamantanecarboxylic ester (16).

A reaction (esterification reaction) of the adamantanemethanol derivative (12) with (meth)acrylic acid or its derivative (13) can be performed in the same manner as above.

[Monomeric Unit of Formula (IIa)]

Monomers corresponding to the monomeric units of the formula (IIa) are represented by the following formula (2a):

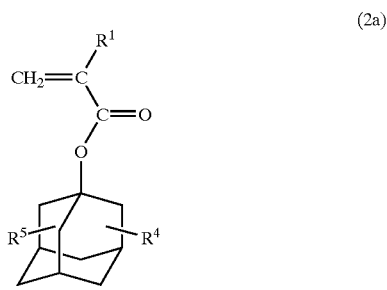

(2a)

wherein $R^1$, $R^4$, and $R^5$ have the same meanings as defined above, of which typical examples include the following compounds.

[2-1] 1-Hydroxy-3-(meth)acryloyloxyadamantane ($R^1$=H or $CH_3$, $R^4$=OH, $R^5$=H)

[2-2] 1,3-Dihydroxy-5-(meth)acryloyloxyadamantane ($R^1$=H or $CH_3$, $R^4$=$R^5$=OH)

[2-3] 1-Carboxy-3-(meth)acryloyloxyadamantane ($R^1$=H or $CH_3$, $R^4$=COOH, $R^5$=H)

[2-4] 1,3-Dicarboxy-5-(meth)acryloyloxyadamantane ($R^1$=H or $CH_3$, $R^4$=$R^5$=COOH)

[2-5] 1-Carboxy-3-hydroxy-5-(meth)acryloyloxyadamantane ($R^1$=H or $CH_3$, $R^4$=COOH, $R^5$=OH)

[2-6] 1-(Meth)acryloyloxy-4-oxoadamantane ($R^1$=H or $CH_3$, $R^4$=4-oxo group, $R^5$=H)

[2-7] 3-Hydroxy-1-(meth)acryloyloxy-4-oxoadamantane ($R^1$=H or $CH_3$, $R^4$=4-oxo group, $R^5$=3-OH)

[2-8] 7-Hydroxy-1-(meth)acryloyloxy-4-oxoadamantane ($R^1$=H or $CH_3$, $R^4$=4-oxo group, $R^5$=7-OH)

[2-9] 1-t-Butoxycarbonyl-3-(meth)acryloyloxyadamantane ($R^1$=H or $CH_3$, $R^4$=t-butoxycarbonyl group, $R^5$=H)

[2-10] 1,3-Bis(t-butoxycarbonyl)-5-(meth)acryloyloxyadamantane ($R^1$=H or $CH_3$, $R^4$=$R^5$=t-butoxycarbonyl group)

[2-11] 1-t-Butoxycarbonyl-3-hydroxy-5(meth)acryloyloxyadamantane ($R^1$=H or $CH_3$, $R^4$=t-butoxycarbonyl group, $R^5$=OH)

[2-12] 1-(2-Tetrahydropyranyloxycarbonyl)-3(meth)acryloyloxyadamantane ($R^1$=H or $CH_3$, $R^4$=2-tetrahydropyranyloxycarbonyl group, $R^5$=H)

[2-13] 1,3-Bis(2-tetrahydropyranyloxycarbonyl)-5(meth)acryloyloxyadamantane ($R^1$=H or $CH_3$, $R^4$=$R^5$=2-tetrahydropyranyloxycarbonyl group)

[2-14] 1-Hydroxy-3-(2-tetrahydropyranyloxycarbonyl)-5(meth)acryloyloxyadamantane ($R^1$=H or $CH_3$, $R^4$=2-tetrahydropyranyloxycarbonyl group, $R^5$=OH)

The compounds of the formula (2a) can be obtained, for example, according to the following reaction process chart:

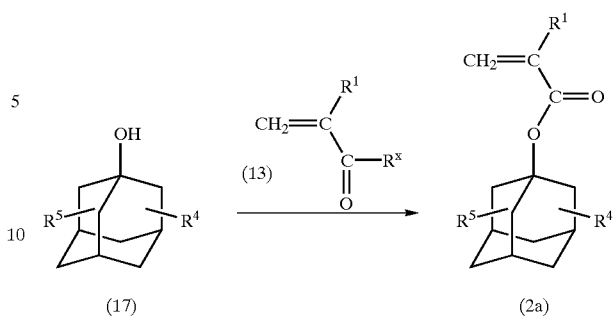

wherein $R^1$, $R^4$, $R^5$, and $R^x$ have the same meanings as defined above.

A compound of the formula (17) for use as a material in the reaction process chart can be obtained by introducing a hydroxyl group or a carboxyl group into an adamantane ring of an adamantane compound. The hydroxyl group or carboxyl group can be introduced into the adamantane ring, for example, by the above process. Of the compounds of the formula (17), a compound in which $R^4$ or $R^5$ is a —$COOR^6$ group can be prepared by subjecting a corresponding carboxylic acid and an alcohol $R^6OH$ to a conventional esterification reaction.

A reaction (esterification reaction) of the compound (17) with a (meth)acrylic acid or its derivative (13) can be performed pursuant to the reaction between the compound of the formula (12) and the (meth)acrylic acid or its derivative (13).

[Monomeric Unit of Formula (IIb)]

Monomers corresponding to the monomeric units of the formula (IIb) are represented by the following formula (2b):

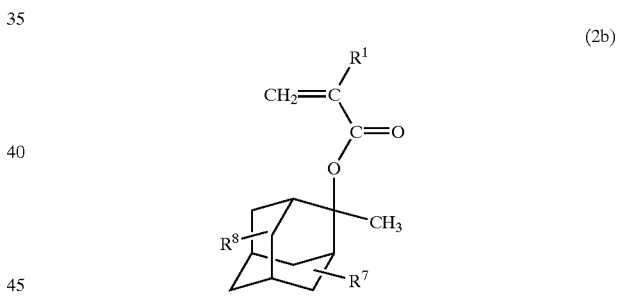

(2b)

wherein $R^1$, $R^7$, and $R^8$ have the same meanings as defined above, of which typical examples are the following compounds.

[2-15] 1,3-Dihydroxy-2-(meth)acryloyloxy-2-methyladamantane ($R^1$=H or $CH_3$, $R^7$=1-OH, $R^8$=3-OH)

[2-16] 1,5-Dihydroxy-2-(meth)acryloyloxy-2-methyladamantane ($R^1$=H or $CH_3$, $R^1$=1-OH, $R^8$=5-OH)

[2-17] 1,3-Dihydroxy-6-(meth)acryloyloxy-6-methyladamantane ($R^1$=H or $CH_3$, $R^1$=1-OH, $R^8$=3-OH)

[2-18] 1-Hydroxy-2-(meth)acryloyloxy-2-methyladamantane ($R^1$=H or $CH_3$, $R^7$=1-OH, $R^1$=H)

[2-19] 5-Hydroxy-2-(meth)acryloyloxy-2-methyladamantane ($R^1$=H or $CH_3$, $R^7$=5-OH, $R^8$=H)

[2-20] 2-(Meth)acryloyloxy-2-methyladamantane ($R^1$=H or $CH_3$, $R^7$=$R^8$=H)

The compounds of the formula (2b) can be obtained according to the following reaction process chart:

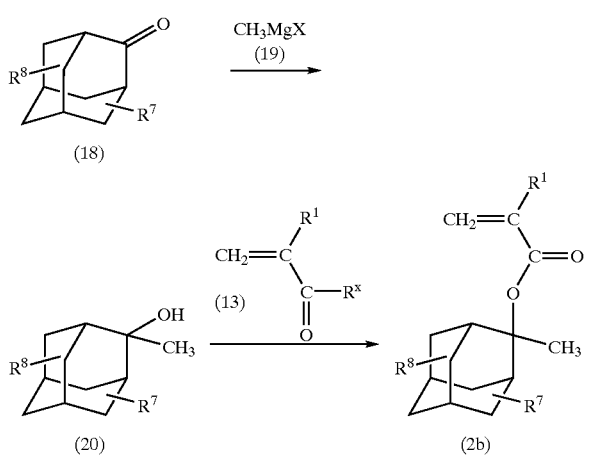

wherein X, $R^1$, $R^7$, $R^8$, and $R^x$ have the same meanings as defined above.

A reaction between an adamantanone derivative (18) and a Grignard reagent (19) in the reaction process chart can be performed pursuant to a conventional Grignard reaction. The amount of the Grignard reagent (19) is, for example, about 0.7 to 3 moles, and preferably about 0.9 to 1.5 moles, relative to 1 mole of the adamantanone derivative (18). When the adamantanone derivative (18) has hydroxyl group(s) on the adamantane ring, the amount of the Grignard reagent should be increased depending on the number of the hydroxyl group(s). The reaction is performed in an inert solvent such as diethyl ether, tetrahydrofuran, or other ethers. A reaction temperature is, for example, about 0 C to 150° C., and preferably about 20° C. to 100° C.

The above-prepared 2-adamantanol derivative (20) is then subjected to a reaction (esterification reaction) with the (meth)acrylic acid or its derivative (13) to yield the compound of the formula (2b). The esterification reaction can be performed pursuant to the reaction between the compound of the formula (12) and the (meth)acrylic acid or its derivative (13).

Of the adamantanone derivatives (18) for use as a material in the above process, a compound having a hydroxyl group on the adamantane ring can be prepared by allowing a 2-adamantanone to come in contact with oxygen in the presence of a N-hydroxyimide catalyst such as N-hydroxyphthalimide, and where necessary a metallic promoter such as a cobalt compound, a manganese compound, or a vanadium compound to thereby introduce a hydroxyl group to the adamantane ring. In this process, the amount of the N-hydroxyimide catalyst is, for example, about 0.0001 to 1 mole, and preferably about 0.001 to 0.5 mole, relative to 1 mole of the 2-adamantanone. The proportion of the metallic promoter is, for example, about 0.0001 to 0.7 mole, and preferably about 0.001 to 0.5 mole, relative to 1 mole of the 2-adamantanone. The oxygen is often used in excess amounts relative to the 2-adamantanone. A reaction is performed in a solvent at a temperature of about 0° C. to 200° C., and preferably about 30° C. to 150° C. at atmospheric pressure or under a pressure (under a load). Such solvents include, for example, acetic acid and other organic acids, acetonitrile and other nitrites, and dichloroethane and other halogenated hydrocarbons.

Alternatively, of the adamantanone derivatives (18), a compound having a hydroxyl group on the adamantane ring can be obtained by allowing an adamantane to react with oxygen in the presence of the N-hydroxyimide catalyst and a strong acid (e.g., hydrogen halides, and sulfuric acid), and where necessary the metallic promoter. The amount of the strong acid is, for example, about 0.00001 to 1 mole, and preferably about 0.0005 to 0.7 mole, relative to 1 mole of the adamantane. The other reaction conditions are the same as in the reaction for introducing a hydroxyl group.

[Monomeric Unit of Formula (III)]Monomers corresponding to the monomeric units of the formula (III) are represented by the following formula (3):

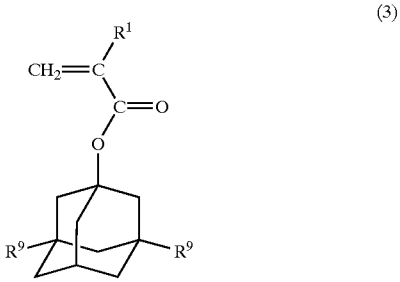

wherein $R^1$ and $R^9$ have the same meanings as defined above, of which typical examples are the following compounds. These compounds can be prepared by a known or conventional technique.

[3-1] 1-(Meth)acryloyloxyadamantane ($R^1$=H or $CH_3$, $R^9$=H)

[3-2] 1-(Meth)acryloyloxy-3,5-dimethyladamantane ($R^1$=H or $CH_3$, $R^9$=$CH_3$)

[Monomeric Unit of Formula (IV)]

Monomers for constituting the monomeric units of the formula (IV) are represented by the following formula (4):

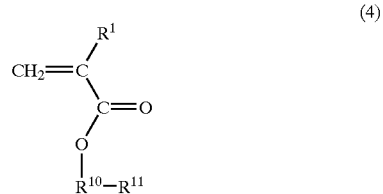

wherein $R^1$, $R^{10}$, and $R^{11}$ have the same meanings as defined above, of which typical examples are the following compounds. These compounds can be prepared by a known or conventional technique.

[4-1] 8-Hydroxymethyl-4-(meth)acryloyloxymethyltricyclo[$5.2.1.0^{2,6}$]decane

[4-2] 4-Hydroxymethyl-8-(meth)acryloyloxymethyltricyclo[$5.2.1.0^{2,6}$]decane

[4-3] 4-(Meth)acryloyloxymethyltetracyclo[4.4.0.1$^{2,5}$.1$^{7,10}$]dodecane

[4-4] 2-(Meth)acryloyloxynorbornane

[4-5] 2-(Meth)acryloyloxyisobornane

[4-6] 2-(Meth)acryloyloxymethylnorbornane

[4-1]
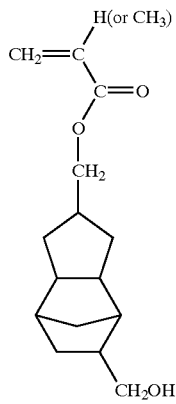

[4-2]
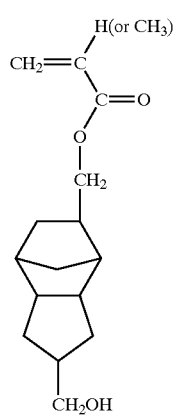

[4-3]
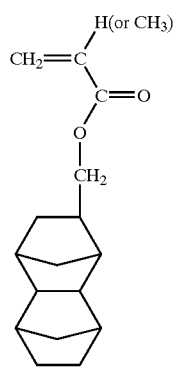

[4-4]
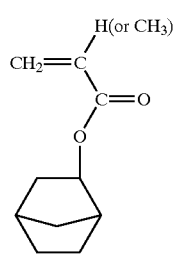

[4-5]
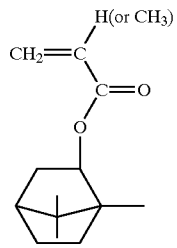

[4-6]
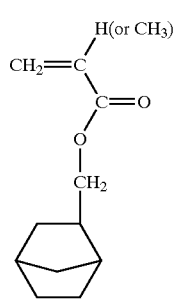

[Monomeric Unit of Formula (Va)]

Monomers for constituting the monomeric units of the formula (Va) are represented by the following formula (5a):

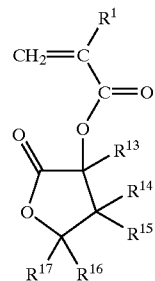

(5a)

wherein $R^1$, $R^{13}$, $R^{14}$, $R^{15}$, $R^{16}$, and $R^{17}$ have the same meanings as defined above, of which typical examples include the following compounds.

[5-1] 2-(Meth)acryloyloxy-γ-butyrolactone ($R^1$=H or $CH_3$, $R^{13}$=$R^{14}$=$R^{15}$=$R^{16}$=$R^{17}$=H)

[5-2] 2-(Meth)acryloyloxy-2-methyl-γ-butyrolactone ($R^1$=H or $CH_3$, $R^{13}$=$CH_3$, $R^{14}$=$R^{15}$=$R^{16}$=$R^{17}$=H)

[5-3] 2-(Meth)acryloyloxy-4,4-dimethyl-γ-butyrolactone ($R^1$=H or $CH_3$, $R^{13}$=$R^{14}$=$R^{15}$=H, $R^{16}$=$R^{17}$=$CH_3$)

[5-4] 2-(Meth)acryloyloxy-2,4,4-trimethyl-γ-butyrolactone ($R^1$=H or $CH_3$, $R^{13}$=$R^{16}$=$R^{17}$=$CH_3$, $R^{14}$=$R_{15}$=H)

[5-5] 2-(Meth)acryloyloxy-3,4,4-trimethyl-γ-butyrolactone ($R^1$=H or $CH_3$, $R^{13}$=$R^{15}$=H, $R^{14}$=$R^{16}$=$R^{17}$=$CH_3$)

[5-6] 2-(Meth)acryloyloxy-2,3,4,4-tetramethyl-γ-butyrolactone ($R^1$=H or $CH_3$, $R^{13}$=$R^{14}$=$R^{16}$=$R^{17}$=$CH_3$, $R^{15}$=H)

[5-7] 2-(Meth)acryloyloxy-3,3,4-trimethyl-γ-butyrolactone ($R^1$=H or $CH_3$, $R^{13}$=$R^{17}$=H, $R^{14}$=$R^{15}$=$R^{16}$=$CH_3$)

[5-8] 2-(Meth)acryloyloxy-2,3,3,4-tetramethyl-γ-butyrolactone ($R^1$=H or $CH_3$, $R^{13}$=$R^{14}$=$R^{15}$=$R^{16}$=$CH_3$, $R^{17}$=H)

[5-9] 2-(Meth)acryloyloxy-3,3,4,4-tetramethyl-γ-butyrolactone ($R^1$=H or $CH_3$, $R^{13}$=H, $R^{14}$=$R^{15}$=$R^{16}$=$R^{17}$=$CH_3$)

[5-10] 2-(Meth)acryloyloxy-2,3,3,4,4-pentamethyl-γ-butyrolactone ($R^1$=H or $CH_3$, $R^{13}$=$R^{14}$=$R^{15}$=$R^{16}$=$R^{17}$=$CH_3$)

The compounds of the formula (5a) can be prepared, for example, according to the following reaction process chart:

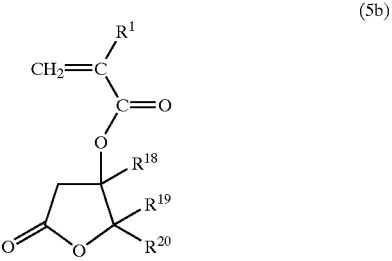

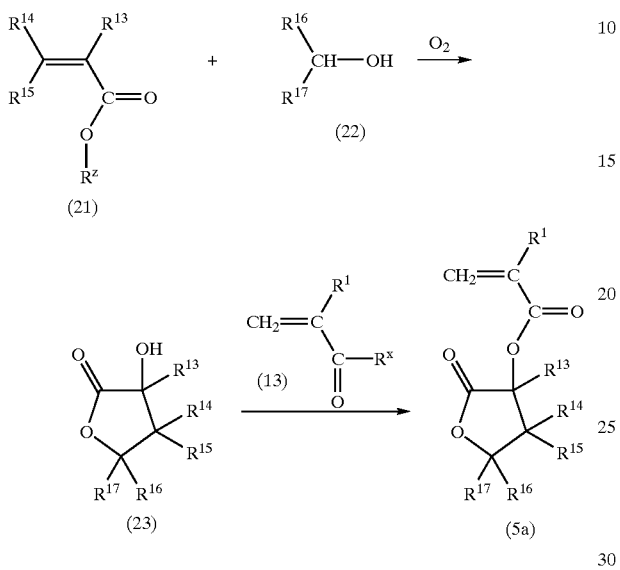

wherein $R^z$ is a hydrocarbon group; and $R^1$, $R^{13}$, $R^{14}$, $R^{15}$, $R^{16}$, $R^{17}$, and $R^x$ have the same meanings as defined above.

Hydrocarbon groups in $R^z$ in the reaction process chart include, but are not limited to, methyl, ethyl, propyl, s-butyl, t-butyl, vinyl, allyl, and other aliphatic hydrocarbon groups (alkyl groups, alkenyl groups, and alkynyl groups) each having about 1 to 6 carbon atoms; phenyl, naphthyl, and other aromatic hydrocarbon groups; and cycloalkyl groups, and other alicyclic hydrocarbon groups.

A reaction of an α,β-unsaturated carboxylic ester (21) with an alcohol (22) and oxygen is performed in the presence of a N-hydroxyimide catalyst such as N-hydroxyphthalimide, and where necessary a metallic promoter such as a cobalt compound (e.g., cobalt acetate or acetylacetonatocobalt). The ratio of the α,β-unsaturated carboxylic ester (21) to the alcohol (22) can be appropriately selected depending on the types (e.g., cost or reactivity) of the two compounds. For example, the alcohol (22) may be used in excess amounts (e.g., about 2 to 50 times by mole) to the α,β-unsaturated carboxylic ester (21). Vice versa, the α,β-unsaturated carboxylic ester (21) may be used in excess amounts to the alcohol (22). The amount of the N-hydroxyimide catalyst is, for example, about 0.0001 to 1 mole, and preferably about 0.001 to 0.5 mole relative to 1 mole of the compound which is used in less amount among the α,β-unsaturated carboxylic ester (21) and the alcohol (22). The proportion of the metallic promoter is, for example, about 0.0001 to 0.7 mole, and preferably about 0.001 to 0.5 mole, relative to 1 mole of the compound which is used in less amount among the α,β-unsaturated carboxylic ester (21) and the alcohol (22). The oxygen is often used in excess amounts relative to the compound which is used in less amount among the α,β-unsaturated carboxylic ester (21) and the alcohol (22). The reaction is performed in a solvent at a temperature of about 0° C. to 150° C., and preferably about 30° C. to 100° C. at atmospheric pressure or under a pressure (under a load). Such solvent include, for example, acetic acid and other organic acids, acetonitrile and other nitrites, trifluoromethylbenzene and other halogenated hydrocarbons, and ethyl acetate and other esters.

A reaction of the above-prepared α-hydroxy-γ-butyrolactone derivative (23) with the (meth)acrylic acid or its derivative (13) can be performed pursuant to the reaction of the 1-adamantanol derivative (12) with the (meth)acrylic acid or its derivative (13).

[Monomeric Unit of Formula (Vb)]

Monomers for constituting the monomeric units of the formula (Vb) are represented by the following formula (5b):

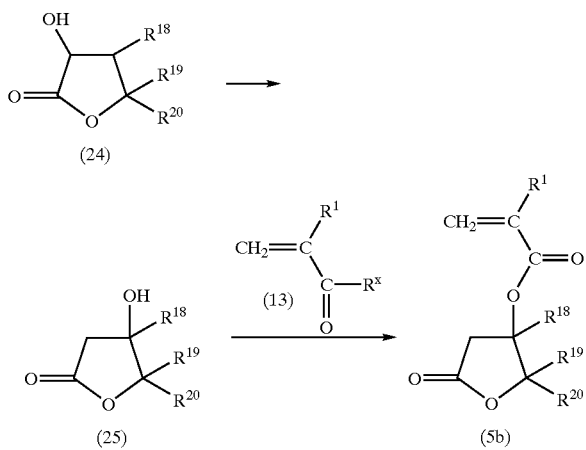

wherein $R^1$, $R^{18}$, $R^{19}$, and $R^{20}$ have the same meanings as defined above, of which typical examples include the following compounds.

[5-11] 3-(Meth)acryloyloxy-γ-butyrolactone ($R^1$=H or $CH_3$, $R^{18}$=$R^{19}$=$R^{20}$=H)

[5-12] 3-(Meth)acryloyloxy-3-methyl-γ-butyrolactone ($R^1$=H or $CH_3$, $R^{18}$=$CH_3$, $R^{19}$=$R^{20}$=H)

[5-13] 3-(Meth)acryloyloxy-4-methyl-γ-butyrolactone ($R^1$=H or $CH_3$, $R^{18}$=$R^{20}$=H, $R^{19}$=$CH_3$)

[5-14] 3-(Meth)acryloyloxy-3,4-dimethyl-γ-butyrolactone ($R^1$=H or $CH_3$, $R^{18}$=$R^{19}$=$CH_3$, $R^{20}$=H)

[5-15] 3-(Meth)acryloyloxy-4,4-dimethyl-γ-butyrolactone ($R^1$=H or $CH_3$, $R^{18}$=H, $R^{19}$=$R^{20}$=$CH_3$)

[5-16] 3-(Meth)acryloyloxy-3,4,4-trimethyl-γ-butyrolactone ($R^1$=H or $CH_3$, $R^{18}$=$R^{19}$=$R^{20}$=$CH_3$)

The compounds of the formula (5b) can be prepared, for example, according to the following reaction process chart:

wherein $R^1$, $R^{18}$, $R^{19}$, $R^{20}$, and $R^x$ have the same meanings as defined above.

The conversion (isomerization) of a α-hydroxy-γ-butyrolactone of the formula (24) to a β-hydroxy-γ-butyrolactone of the formula (25) in the above reaction process chart can be performed by dissolving the compound of the formula (24) in a solvent where necessary with a small amount of water or an acid such as sulfuric acid or hydrochloric acid. Such solvents include, but are not limited to, acetonitrile, acetic acid, and ethyl acetate. A reaction temperature is, for example, about 0° C. to 150° C., and preferably about 20° C. to 100° C. The α-hydroxy-γ-butyrolactone (24) for use as a material can be prepared in the same manner as in the compound of the formula (23). Alternatively, the compound of the formula (25) can be obtained by in the following manner. Specifically, the compound of the formula (24) is subjected to a reaction (dehydration reaction) with phosphorus pentoxide to yield a corresponding α,β-unsaturated γ-butyrolactone, and this compound is then allowed to react with hydrogen peroxide or a peracid such as m-chloroperbenzoic acid to thereby epoxidize a double bond, and the resulting epoxidized product is hydrogenated in the presence of a catalyst such as Pd—C to yield the compound of the formula (25). Further alternatively, the compound of the formula (25) can be prepared by a known or conventional technique for the production of a β-hydroxy-γ-butyrolactone.

A reaction between the β-hydroxy-γ-butyrolactone (25) with the (meth)acrylic acid or its derivative of the formula (13) can be performed pursuant to the reaction between the compound of the formula (12) and the (meth)acrylic acid or its derivative (13).

[Monomeric Unit of Formula (VI)]

Monomers for constituting the monomeric units of the formula (VI) are represented by the following formula (6):

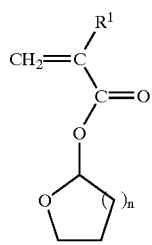

(6)

wherein $R^1$ and n have the same meanings as defined above, of which typical examples include the following compounds.

[6-1] 2-Tetrahydropyranyl(meth)acrylate ($R^1$=H or $CH_3$, n=2)

[6-2] 2-Tetrahydrofuranyl(meth)acrylate ($R^1$=H or $CH_3$, n=1)

[Monomeric Unit of Formula (VII)]

Monomers for constituting the monomeric units of the formula (VII) are represented by the following formula (7):

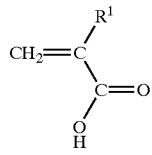

(7)

wherein $R^1$ has the same meaning as defined above, of which typical examples include the following compound.

[7-1] (Meth)acrylic acid ($R^1$=H or $CH_3$)

The invented polymeric compounds are satisfactory in all the transparency, alkali-solubility, adhesion, and etching resistance as described above, and can be advantageously used as photoresist resins.

The invented photoresist resin composition comprises the invented polymeric compound and a light-activatable acid generator.

As the light-activatable acid generator, known or conventional compounds which can efficiently generate an acid by action of exposure can be employed. Such compounds include, but are not limited to, diazonium salts, iodonium salts (e.g., diphenyliodonium hexafluorophosphate), sulfonium salts (e.g., triphenylsulfonium hexafluoroantimonate, triphenylsulfonium hexafluorophosphate, and triphenylsulfoniummethanesulfonate), sulfonates [e.g., 1-phenyl-1-(4-methylphenyl)sulfonyloxy-1-benzoylmethane, 1,2,3-trisulfonyloxymethylbenzene, 1,3 dinitro-2-(4-phenylsulfonyloxymethyl)benzene, and 1-phenyl-1-(4-methylphenylsulfonyloxymethyl)-1-hydroxy-1-benzoylmethane], oxathiazol derivatives, s-triazine derivatives, disulfone derivatives (e.g., diphenyldisulfone), imide compounds, oxime sulfonates, diazonaphthoquinone, and benzoin tosylate. Each of these light-activatable acid generators can be used alone or in combination.

The amount of the light-activatable acid generator can be appropriately selected depending on the strength of an acid generated through light irradiation or the proportion of each monomeric unit in the polymeric compound, and is, for example, about 0.1 to 30 parts by weight, preferably about 1 to 25 parts by weight, and more preferably about 2 to 20 parts by weight, relative to 100 parts by weight of the polymeric compound.

The photoresist resin composition may further comprise additional components. Such additional components include, but are not limited to, alkali-soluble resins (e.g., novolak resins, phenol resins, imide resins, and carboxyl-group-containing resins), and other alkali-soluble components, coloring agents (e.g., dyestuffs), and organic solvents (e.g., hydrocarbons, halogenated hydrocarbons, alcohols, esters, amides, ketones, ethers, Cellosolves, Carbitols, glycol ether esters, and mixtures of these solvents).

The photoresist resin composition is applied onto a base or a substrate, is dried, and the resulting film (resist film) is exposed to light through a predetermined mask (or is further subjected to post-exposure baking) to form a latent image pattern, and the film is then developed to highly precisely yield a fine pattern.

Such bases or substrates include, for example, silicon wafers, metals, plastics, glasses, and ceramics. The photoresist resin composition can be applied using a conventional application means such as a spin coater, a dip coater, and a roller coater. The applied film has a thickness of, for example, about 0.1 to 20 μm, and preferably about 0.3 to 2 μm.

Light rays with different wavelengths such as ultraviolet rays and X-rays can be used for exposure. For example, g-ray, i-ray, and excimer laser (e.g., XeCl, KrF, KrCl, ArF, or ArCl excimer laser) are usually used for semiconductor resists. An exposure energy is, for example, about 1 to 1000 $mJ/cm^2$, and preferably about 10 to 500 $mJ/cm^2$.

An acid is generated from the light-activatable acid generator by action of light irradiation, and the acid allows a protective group (leaving group) of a carboxyl group of the polymeric compound to eliminate immediately. Thus, a carboxyl group which contributes to make the resin soluble is formed. Subsequent development with water or an alkali developer can precisely form a predetermined pattern.

According to the present invention, the polymer includes a monomeric unit having a specific adamantane skeleton and can exhibit a high etching resistance while maintaining satisfactory transparency, alkali-solubility, and adhesion.

The present invention will now be illustrated in further detail with reference to several examples below, which are not intended to limit the scope of the invention. A compound indicated by "acrylate" subsequent to a compound number (monomer number) means a compound having an acryloyloxy group, among two compound corresponding to the compound number described in the specification. A compound indicated by "methacrylate" means a compound having a methacryloyloxy group, of the two compounds. The figures at lower right of the parentheses in the structural formulae are mole percentages of the monomeric unit in question.

PRODUCTION EXAMPLE 1

Production of 1-(1-Acryloyloxy-1-methylethyl) adamantane [1-1 (Acrylate)]

Initially, a 12% by weight methylmagnesium bromidetetrahydrofuran solution was prepared from methyl bromide and metal magnesium, and 59.63 g (0.063 mol) of the solution was placed in a flask. To this solution, a solution of 4.73 g (0.02 mol) of n-butyl 1-adamantanecarboxylate in 7.21 g of tetrahydrofuran was added dropwise, while maintaining an inside temperature at 35° C. or lower. After the completion of addition, the resulting mixture was stirred at room temperature for 1 hour.

The above-prepared reaction mixture was added dropwise to 32.37 g of a 10% by weight aqueous sulfuric acid solution, while maintaining an inside temperature at 35° C. or lower, and the resulting mixture was neutralized with a 5% by weight aqueous sodium hydroxide solution and was separated into an aqueous layer and an organic layer. The aqueous layer was extracted with two portions of 20 g of benzene. The extract was added to the organic layer and the resulting mixture was washed with 20 g of a saturated aqueous sodium chloride solution and was dried over anhydrous sodium sulfate. The dried product was then filtrated, and the filtrate was concentrated under a reduced pressure to yield α,α-dimethyl-1-adamantanemethanol in a yield of 88.7% on the basis of n-butyl 1-adamantanecarboxylate.

A total of 15 mmole of acrylic chloride was added dropwise to a mixture containing 10 mmole of the above-prepared α,α-dimethyl-1-adamantanemethanol, 20 mmole of triethylamine, and 40 ml of tetrahydrofuran, over about 30 minutes. After the completion of addition, the resulting mixture was stirred at room temperature for 6 hours. Water was added to the reaction mixture, and the resulting mixture was concentrated, and the concentrate was subjected to column chromatography on a silica gel to yield the title compound in a yield of 76%.

[Spectrum Data]
$^1$H-NMR (500 MHz, CDCl$_3$) δ: 1.49 (s, 6H), 1.60–1.75 (m, 12H), 2.02 (m, 3H), 5.71 (dd, 1H), 6.05 (dd, 1H), 6.28 (dd, 1H).

PRODUCTION EXAMPLE 2

Production of 1-(1-Methacryloyloxy-1-methylethyl) adamantane [1-1 (Methacrylate)]

The title compound was prepared in the same manner as in Production Example 1, except that methacrylic chloride was used instead of acrylic chloride.

[Spectrum Data]
$^1$H-NMR (500 MHz, CDCl$_3$) δ: 1.49 (s, 6H), 1.56–1.80 (m, 12H), 1.92 (brs, 3H), 2.02 (m, 3H), 5.46 (brs, 1H), 6.02 (brs, 1H).

PRODUCTION EXAMPLE 3

Production of 1-(1-Acryloyloxy-1-methylethyl)-3-hydroxyadamantane [1-2 (Acrylate)]

A mixture of 0.3 mol of 1-adamantanol, 1.8 mol of biacetyl, 1.5 mmole of cobalt(II) acetate, and 300 ml of acetic acid was stirred at 60° C. in an oxygen atmosphere (1 atm) for 4 hours. The reaction mixture was concentrated to about 20% by weight, and was extracted with ethyl acetate, was dried, and was washed with hexane to yield 1-acetyl-3-adamantanol in a yield of 20% with a conversion rate from 1-adamantanol of 82%.

[Spectrum Data of 1-Acetyl-3-adamantanol]
IR (cm$^{-1}$): 3401, 2897, 2854, 1683, 1430, 1019, 605
$^{13}$C-NMR (CDCl$_3$) δ: 24.3, 29.9, 34.8, 36.8, 43,9, 45.4, 49.6, 67.9, 212.4.

Separately, 1.1 mol of metal magnesium was placed in a flask, and the inside atmosphere of the flask was replaced with nitrogen, and a solution containing 1.0 mol of methyl bromide in 500 ml of ethyl ether was placed in the flask in such an amount that the metal magnesium was dipped in the solution. A reaction was then initiated with a small amount of iodine, and the remainder ethyl ether solution of methyl bromide was added dropwise to the mixture at such a rate that the solvent was gently refluxed. After the completion of addition, the reflux operation was continued for further 2 hours.

A solution of 1.0 mol of the above-prepared 1-acetyl-3-adamantanol in 1000 ml of ethyl ether was added dropwise to the above-obtained reaction mixture in such a rate that the solvent was gently refluxed. After the completion of addition, the reflux was continued for further 2 hours. The resulting reaction mixture was added dropwise to a 10% by weight hydrochloric acid (in an amount corresponding to HCl: 1 mol) cooled on ice, while stirring, and the mixture was stirred for further 2 hours at a temperature in a range from 0° C. to room temperature.

A 10% aqueous sodium hydroxide solution was added to the reaction mixture to adjust the mixture to around neutrality, and the neutralized mixture was separated into an aqueous layer and an organic layer; the aqueous layer was extracted with two portions of 1000 ml of ethyl ether; the extract was added to the organic layer and the mixture was concentrated; and the concentrate was cooled for crystallization to yield 3-hydroxy-α,α-dimethyl-1-adamantanemethanol in a yield of 67%.

[Spectrum Data of 3-Hydroxy-α,α-dimethyl-1-adamantanemethanol]
MS (CI) m/e: 197, 179, 135.

A total of 10 mmole of acrylic chloride was added dropwise to a mixture of 10 mmole of the above-prepared 3-hydroxy-α,α-dimethyl-1-adamantanemethanol, 10 mmole of triethylamine, and 40 ml of tetrahydrofuran ,over about 30 minutes. After the completion of addition, the resulting mixture was stirred at room temperature for 6 hours. Water was added to the reaction mixture and the mixture was concentrated, and the concentrate was subjected to column chromatography on a silica gel to yield the title compound in a yield of 23%.

[Spectrum Data]
$^1$H-NMR (CDCl$_3$) δ: 1.52 (s, 6H), 1.54–1.70 (m, 13H), 2.27 (m, 2H), 5.73 (dd, 1H), 6.04 (dd, 1H), 6.28 (dd, 1H).

PRODUCTION EXAMPLE 4

Production of 1-Hydroxy-3-(1-methacryloyloxy-1-methylethyl)adamantane [1-2 (Methacrylate)]

The title compound was prepared in the same manner as in Production Example 3, except that methacrylic chloride was used instead of acrylic chloride.

[Spectrum Data]
$^1$H-NMR (CDCl$_3$) δ: 1.52 (s, 6H), 1.54–1.70 (m, 13H), 1.92 (brs, 3H), 2.27 (m, 2H), 5.46 (brs, 1H), 6.02 (brs, 1H).

PRODUCTION EXAMPLE 5

Production of 1,3-Dihydroxy-5-(1-methacryloyloxy-1-methylethyl)adamantane [1-3 (Methacrylate)]

A mixture of 1 mol of 1-adamantanecarboxylic acid, 0.1 mol of N-hydroxyphthalimide, 1 mmole of acetylacetonato-cobalt (II), and 2.5 L of acetic acid was stirred at 75° C. in an oxygen atmosphere (1 atm) for 12 hours. The reaction mixture was concentrated and was then subjected to column chromatography on a silica gel to yield 3,5-dihydroxy-1-adamantanecarboxylic acid.

A mixture of 300 mmole of the above-prepared 3,5-dihydroxy-1-adamantanecarboxylic acid, 450 mmole of n-butanol, 15 mmole of sulfuric acid, and 900 ml of toluene was stirred under reflux of toluene for 5 hours. The reaction mixture was concentrated and was then subjected to column chromatography on a silica gel to yield n-butyl 3,5-dihydroxy-adamantanecarboxylate.

A mixture of 200 mmole of the above-prepared n-butyl 3,5-dihydroxy-1-adamantanecarboxylate, 440 mmole of 2-methoxyethoxymethyl chloride, 440 mmole of triethylamine, and 400 ml of tetrahydrofuran (THF) was refluxed for 3 hours. The reaction mixture was concentrated and was then subjected to column chromatography on a silica gel to yield n-butyl 3,5-bis(2-methoxyethoxymethoxy)-1-adamantanecarboxylate.

Separately, 0.55 mol of metal magnesium was placed in a flask, and the inside atmosphere of the flask was replaced with nitrogen, and a solution of 0.5 mol of bromomethane in 250 ml of THF was placed in the flask in such an amount that the metal magnesium was dipped in the solution. A reaction was then initiated with a small amount of iodine, and the remainder THF solution of bromomethane was added dropwise to the mixture at such a rate that the solvent was gently refluxed. After the completion of addition, The reflux operation was continued for further 2 hours to yield a methylmagnesium bromide solution.

A solution of 100 mmole of the above-prepared n-butyl 3,5-bis(2-methoxyethoxymethoxy)-1-adamantanecarboxylate in 150 ml of THF was added dropwise to the above-prepared methylmagnesium bromide solution in such a rate that the solvent 4 was gently refluxed. The reflux operation was continued for further 2 hours after the completion of addition. The resulting reaction mixture was added dropwise to a 10% by weight hydrochloric acid cooled on ice, while stirring, and the mixture was stirred for further 2 hours at a temperature in a range from 0° C. to room temperature. A 10% by weight aqueous sodium hydroxide solution was added to the reaction mixture to adjust the mixture to around neutrality, and the neutralized mixture was separated to an organic layer and an aqueous layer; the aqueous layer was extracted with toluene; the organic layer was concentrated; and the concentrate was subjected to column chromatography on a silica gel to yield α,α-dimethyl-3,5-bis(2-methoxyethoxymethoxy)-1-adamantanemethanol.

A total of 30 mmole of methacrylic chloride was added dropwise to a mixture of 20 mmole of the above-prepared α,α-dimethyl-3,5-bis(2-methoxyethoxymethoxy)-1-adamantanemethanol, 40 mmole of triethylamine, and 80 ml of THF, over about 30 minutes. The resulting mixture was stirred at room temperature for 6 hours after the completion of addition. Water was added to the reaction mixture, and the resulting mixture was then extracted with ethyl acetate, the organic layer was concentrated, and the concentrate was subjected to column chromatography on a silica gel to yield 1-(1-methacryloyloxy-1-methylethyl)-3,5-bis(2-methoxyethoxymethoxy)adamantane.

A mixture of 10 mmole of the above-prepared 1-(1-methacryloyloxy-1-methylethyl)-3,5-bis(2-methoxyethoxymethoxy)adamantane, 1 mmole (in terms of HCl) of 6 N-HCl, and 40 ml of acetone was stirred at room temperature for 5 hours. An aqueous ammonium chloride solution was added to the reaction mixture; the resulting mixture was extracted with ethyl acetate; the organic layer was concentrated; and the concentrate was subjected to column chromatography on a silica gel to yield the title compound.

[Spectrum Data]
$^1$H-NMR (500 MHz, DMSO-d$_6$) δ: 1.33–1.97 (m, 21H), 2.22 (m, 1H), 4.68 (brs, 2H), 5.74 (brs, 1H), 5.91 (brs, 1H)

PRODUCTION EXAMPLE 6

Production of 1-Acryloyloxy-3-hydroxyadamantane [2-1 (Acrylate)]

To a mixture of 10 mmole of 1,3-adamantanediol, 15 mmole of triethylamine, and 100 ml of tetrahydrofuran, 13 mmole of acrylic chloride was added drop wise over about 30 minutes. After the completion of addition, the resulting mixture was stirred at 50° C for 1.5 hours. Water was added to the reaction mixture; the mixture was then extracted with ethyl acetate; the organic layer was concentrated; and the concentrate was subjected to column chromatography on a silica gel to yield the title compound in a yield of 63%.

[Spectrum Data]
$^1$H-NMR (CDCl$_3$) δ: 1.47–1.61 (m, 2H), 1.62–1.80 (m, 5H), 2.00–2.17 (m, 6H), 2.34 (m, 2H), 5.75 (dd, 1H), 6.03 (dd, 1H), 6.30 (dd, 1H).

PRODUCTION EXAMPLE 7

Production of 1-Hydroxy-3-methacryloyloxyadamantane [2-1 (Methacrylate)]

The title compound was prepared in the same manner as in Production Example 6, except that methacrylic chloride was used instead of acrylic chloride.

[Spectrum Data]
$^1$H-NMR (CDCl$_3$) δ: 1.48–1.61 (m, 6H), 1.89 (s, 3H), 2.00–2.16 (m, 7H), 2.34 (m, 2H), 5.49 (brs, 1H), 6.01 (brs, 1H).

PRODUCTION EXAMPLE 8

Production of 1-Acryloyloxy-3,5-dihydroxyadamantane [2-2 (Acrylate)]

The title compound was prepared in the same manner as in Production Example 6, except that 1,3,5-adamantanetriol was used instead of 1,3-adamantanediol.

[Spectrum Data]
$^1$H-NMR (CDCl$_3$) δ: 1.54–1.87 (m, 6H), 1.90–2.80 (m, 9 H), 5.78 (dd, 1H), 6.04 (dd, 1H), 6.31 (dd, 1H).

PRODUCTION EXAMPLE 9

Production of 1,3-Dihydroxy-5-methacryloyloxyadamantane [2-2 (Methacrylate)]

The title compound was prepared in the same manner as in Production Example 6, except that 1,3,5-adamantanetriol and methacrylic chloride were used instead of 1,3-adamantanediol and acrylic chloride, respectively.

[Spectrum Data]
$^1$H-NMR (CDCl$_3$) δ: 1.35–1.95 (m, 13H), 2.23 (m, 1H), 4.73 (s, 2H), 5.59 (brs, 1H), 5.92 (brs, 1H).

PRODUCTION EXAMPLE 10

Production of 2-Methacryloyloxy-4,4-dimethyl-γ-butyrolactone [5–3 (Methacrylate)]

A mixture of 3 mmole of ethyl acrylate, 3 ml of 2-propanol, 0.6 mmole of N-hydroxyphthalimide, 0.003 mmole of cobalt(II) acetate, 0.015 mmole of acetylacetonatocobalt (II), and 1 ml of acetonitrile was stirred at 60° C. in an oxygen atmosphere (1 atm) for 12 hours. The reaction mixture was concentrated, and the concentrate was subjected to chromatography on a silica gel to yield 2-hydroxy-4,4-dimethyl-γ-butyrolactone in a yield of 75%.

[Spectrum Data of 2-Hydroxy-4,4-dimethyl-γ-γ-butyrolactone]
$^1$H-NMR (CDCl$_3$) δ: 1.42 (s, 3H), 1.51 (s, 3H), 2.06 (dd, 1H), 2.52 (dd, 1H), 3.03 (brs, 1H), 4.63 (t, 1H).

A mixture of 100 mmole of the above-prepared 2-hydroxy4,4-dimethyl-γ-butyrolactone, 150 mmole of methacrylic chloride, 150 mmole of triethylamine, and 300 ml of toluene was stirred at 25° C. for 4 hours. Water was added to the reaction mixture, the organic layer was then concentrated, and the concentrate was subjected to column chromatography on a silica gel to yield 2-methacryloyloxy-4,4-dimethyl-γ-butyrolactone in a yield of 85%.

[Spectrum Data of 2-Methacryloyloxy-4,4-dimethyl-butyrolactone]
$^1$H-NMR (CDCl$_3$) δ: 1.47 (s, 3H), 1.54 (s, 3H), 1.92 (s, 3H), 2.10 (dd, 1H), 2.63 (dd, 1H), 5.63 (brs, 1H), 5.94 (m, 1H), 6.18 (brs, 1H).

PRODUCTION EXAMPLE 11

Production of 2-Acryloyloxy-2,4,4-trimethyl-γ-butyrolactone

[5–4 (Acrylate)]

The title compound was prepared in the same manner as in Production Example 10, except that ethyl methacrylate and acrylic chloride were used instead of ethyl acrylate and methacrylic chloride, respectively.

[Spectrum Data]
$^1$H-NMR (CDCl$_{13}$) δ: 1.47 (s, 3H), 1.59 (s, 3H), 1.68 (s, 3H), 2.20 (dd, 1H), 2.63 (dd, 1H), 5.90 (dd, 1H), 6.13 (dd, 1H), 6.46 (dd, 1H)

PRODUCTION EXAMPLE 12

Production of 3-Methacryloyloxy-4,4-dimethyl-γ-butyrolactone [5–15 (Methacrylate)]

In dioxane, 2-hydroxy-4,4-dimethyl-γ-butyrolactone prepared in the same manner as in Production Example 10 was subjected to a reaction (dehydration reaction) with equivalent P$_2$O$_5$ at room temperature to yield a corresponding α,β-unsaturated-γ-butyrolactone in a yield of 30%. The prepared α,β-unsaturated-γ-butyrolactone was then allowed to react with m-chloroperbenzoic acid (MCPBA) in methylene chloride at room temperature to yield 2,3-epoxy-4,4-dimethyl-γ-butyrolactone in a yield of 85%. Hydrogen was bubbled in a mixture of 10 mmole of the above-prepared 2,3-epoxy-4,4-dimethyl-γ-butyrolactone, 1 g of a 5% by weight Pd-C, and 20 ml of tetrahydrofuran at room temperature for 11 hours. The reaction mixture was filtrated and was concentrated, and the concentrate was subjected to column chromatography on a silica gel to yield 3-hydroxy-4,4-dimethyl-γ-butyrolactone in a yield of 63%.

The title compound was obtained in a yield of 87% by allowing the above-prepared 3-hydroxy-4,4-dimethyl-γ-butyrolactone to react with methacrylic chloride in the same manner as in Production Example 10.

[Spectrum Data]
MS m/e: 199 (M+);
IR (cm$^{-1}$): 3045, 1772, 1190.

PRODUCTION EXAMPLE 13

Production of 3-Acryloyloxy-3,4,4-trimethyl-γ-butyrolactone [5–16 (Acrylate)]

By using ethyl crotonate instead of ethyl acrylate, 2 hydroxy-3,4,4-trimethyl-γ-butyrolactone was prepared in a yield of 15% in the same manner as in Production Example 10. The prepared 2-hydroxy-3,4,4-trimethyl-γ-butyrolactone was subjected to a reaction (dehydration reaction) with equivalent P$_2$O$_5$ at room temperature to yield a corresponding α,β-unsaturated-γ-butyrolactone in a yield of 34%. This compound was then allowed to react with m-chloroperbenzoic acid (MCPBA) in methylene chloride at room temperature to yield 2,3epoxy-3,4,4-trimethyl-γ-butyrolactone in a yield of 75%. Hydrogen was bubbled in a mixture of 10 mmole of the above-prepared 2,3-epoxy-3,4,4-trimethyl-γ-butyrolactone, 1 g of a 5% by weight Pd-C, and 20 ml of tetrahydrofuran at room temperature for 11 hours. The reaction mixture was filtrated and was concentrated, and the concentrate was subjected to column chromatography on a silica gel to yield 3-hydroxy-3,4,4-trimethyl-γ-butyrolactone in a yield of 82%.

The title compound was obtained in a yield of 85% by allowing the prepared 3-hydroxy-3,4,4-trimethyl-γ-butyrolactone to react with acrylic chloride in the same manner as in Production Example 10.

[Spectrum Data]
MS m/e: 199 (M+); IR (cm$^{-1}$): 3020, 1768, 1210;
$^1$H-NMR (CDCl$_{13}$) δ: 1.43 (s, 3H), 1.51 (s, 3H), 1.63 (s, 3H), 2.92 (d, 1H), 3.30 (d, 1H), 5.92 (dd, 1H), 6.14 (dd, 1H), 6.44 (dd, 1H).

EXAMPLE 1

Synthesis of Resin Having the Following Structure

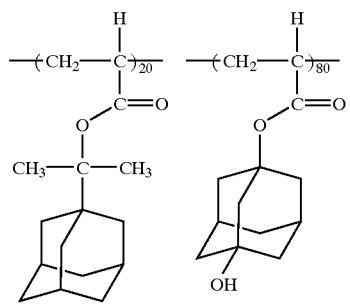

In an Erlenmeyer flask, 2.00 g (8.1 mmole) of the monomer [1-1] (acrylate), 7.17 g (32.3 mmole) of the monomer

[2–1] (acrylate), and 0.92 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., and the reaction mixture was put into 500 ml of hexane, and the formed precipitation was separated by filtration. The precipitation and purification procedure was repeated once again to yield 6.82 g of a target resin. The recovered polymer was subjected to gel permeation chromatographic analysis to find that the polymer had Mw of 8500 and a molecular weight distribution (Mw/Mn) of 2.06. In $^1$H-NMR (in DMSO-$d_6$) spectrum, signals were observed at 0.8–2.5 (broad), 1.6, 1.9, 2.1, and 4.6 ppm.

EXAMPLE 2

Synthesis of Resin Having the Following Structure

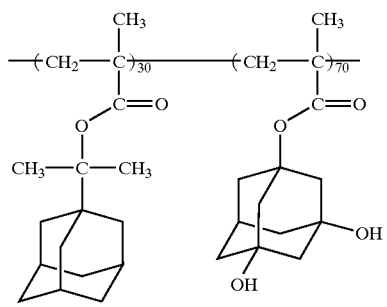

In an Erlenmeyer flask, 2.00 g (7.6 mmole) of the monomer [1-1] (methacrylate), 7.17 g (30.4 mmole) of the monomer [2-2 (methacrylate), and 0.92 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., and the reaction mixture was put into 500 ml of hexane, and the formed precipitation was separated by filtration. The precipitation and purification procedure was repeated once again to yield 6.82 g of a target resin. The recovered polymer was subjected to gel permeation chromatographic analysis to find that the polymer had Mw of 8200 and a molecular weight distribution (Mw/Mn) of 2.26. In $^1$H-NMR (in DMSO-$d_6$) spectrum, signals were observed at 0.8–2.9 (broad), 1.5, 1.9, 2.1, and 4.6 ppm.

EXAMPLE 3

Synthesis of Resin Having the Following Structure

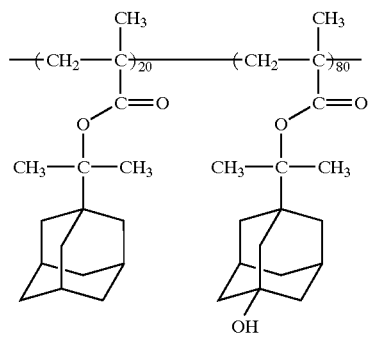

In an Erlenmeyer flask, 2.00 g (7.6 mmole) of the monomer [1-1] (methacrylate), 8.51 g (30.4 mmole) of the monomer [1-2] (methacrylate), and 1.05 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 6.52 g of a target resin. The recovered polymer was subjected to gel permeation chromatographic analysis to find that the polymer had Mw of 8100 and a molecular weight distribution (Mw/Mn) of 2.37. In $^1$H-NMR (in DMSO-$d_6$) spectrum, signals were observed at 0.8–2.5 (broad), 1.6, 1.9, 2.1, and 4.6 ppm.

EXAMPLE 4

Synthesis of Resin Having the Following Structure

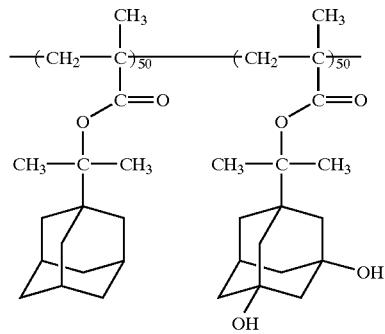

In an Erlenmeyer flask, 4.5 g (17.2 mmole) of the monomer [1-1] (methacrylate), 4.82 g (17.2 mmole) of the monomer ([1-3] (methacrylate), and 0.98 g of an initiator (produced by Wako Pure Chemical Industries, Ltd. under the trade name of "V-65") were placed and were dissolved in 25 g of THF (tetrahydrofuran) to yield a monomer solution.

Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.52 g of a target resin. The recovered polymer was subjected to gel permeation chromatographic analysis to find that the polymer had Mw of 8300 and a molecular weight distribution (Mw/Mn) of 2.21. In $^1$H-NMR (in DMSO-$d_6$) spectrum, signals were observed at 0.8–2.5 (broad), 1.5, 1.9, 2.1, and 4.6 ppm.

EXAMPLE 5

Synthesis of Resin Having the Following Structure

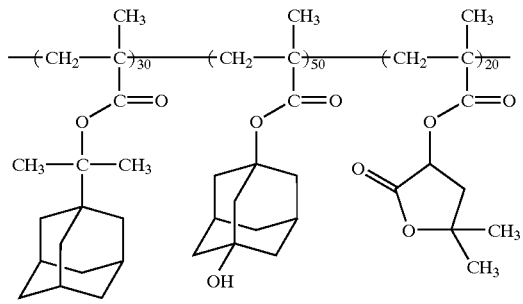

In an Erlenmeyer flask, 3.66 g (14.0 mmole) of the monomer [1-1] (methacrylate), 5.50 g (23.3 mmole) of the monomer [2-1] (methacrylate), 1.84 g (9.3 mmole) of the monomer [5-3] (methacrylate), and 1.10 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.76 g of a target resin. The recovered polymer was subjected to gel permeation chromatographic analysis to find that the polymer had Mw of 7200 and a molecular weight distribution (Mw/Mn) of 1.99. In $^1$H-NMR (in DMSO-$d_6$) spectrum, signals were observed at 0.8–2.5 (broad), 1.5, 1.9, 2.1, 4.6, and 5.3 ppm.

EXAMPLE 6

Synthesis of Resin Having the Following Structure

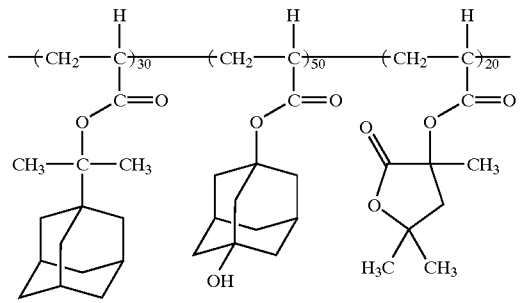

In an Erlenmeyer flask, 3.33 g (13.4 mmole) of the monomer [1-1] (acrylate), 4.95 g (22.3 mmole) of the monomer [2-1] (acrylate), 1.65 g (8.3 mmole) of the monomer [5-4] (acrylate), and 0.96 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.42 g of a target resin. The recovered polymer was subjected to gel permeation chromatographic analysis to find that the polymer had Mw of 7200 and a molecular weight distribution (Mw/Mn) of 1.99. In $^1$H-NMR (in DMSO-$d_6$) spectrum, signals were observed at 0.8–2.5 (broad), 1.5, 1.9, 2.1, and 4.6 ppm.

EXAMPLE 7

Synthesis of Resin Having the Following Structure

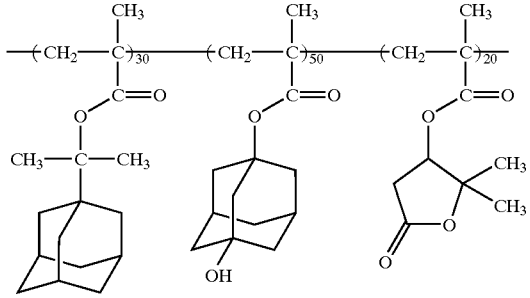

In an Erlenmeyer flask, 2.20 g (8.4 mmole) of the monomer [1-1] (methacrylate), 7.88 g (33.3 mmole) of the monomer [2-1] (methacrylate), 1.11 g (4.2 mmole) of the monomer [5-15] (methacrylate), and 1.11 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.62 g of a target resin. The recovered polymer was subjected to gel permeation chromatographic analysis to find that the polymer had Mw of 9400 and a molecular weight distribution (Mw/Mn) of 2.38. In $^1$H-NMR (in DMSO-$d_6$) spectrum, signals were observed at 0.8–2.9 (broad), 1.6, 1.9, 2.1, 4.3, and 4.6 ppm.

EXAMPLE 8

Synthesis of Resin Having the Following Structure

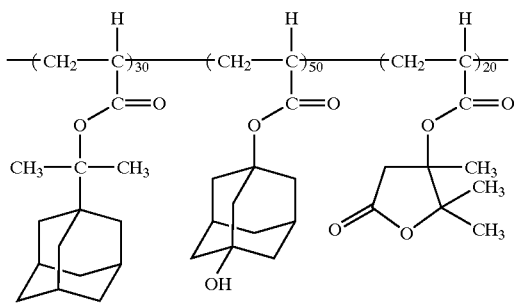

In an Erlenmeyer flask, 3.45 g (13.9 mmole) of the monomer [1-1] (acrylate), 5.18 g (23.2 mmole) of the monomer [2-1] (acrylate), 1.85 g (9.3 mmole) of the monomer [5-16] (acrylate), and 1.08 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.23 g of a target resin. The recovered polymer was subjected to gel permeation chromatographic analysis to find that the polymer had Mw of 8800 and a molecular weight distribution (Mw/Mn) of 2.15. In $^1$H-NMR (in DMSO-$d_6$) spectrum, signals were observed at 0.8–2.5 (broad), 1.5, 1.9, 2.1, 4.3, and 4.6 ppm.

EXAMPLE 9

Synthesis of Resin Having the Following Structure

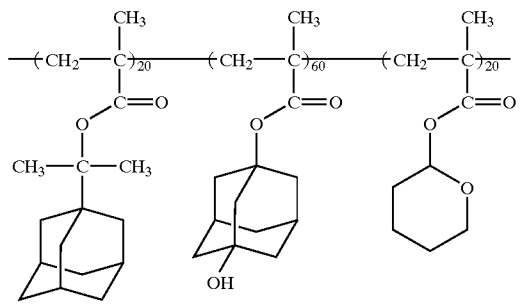

In an Erlenmeyer flask, 2.23 g (8.5 mmole) of the monomer [1-1] (methacrylate), 6.05 g (24.6 mmole) of the monomer [2-1] (methacrylate), 1.57 g (8.6 mmole) of the monomer [6-1] (methacrylate), and 0.98 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.68 g of a target resin. The recovered polymer was subjected to gel permeation chromatographic analysis to find that the polymer had Mw of 8400 and a molecular weight distribution (Mw/Mn) of 2.38. In $^1$H-NMR (in DMSO-$d_6$) spectrum, signals were observed at 0.8–2.5 (broad), 1.5, 1.9, 2.1, 3.6, 3.9, 4.6, and 5.9 ppm.

EXAMPLE 10

Synthesis of Resin Having the Following Structure

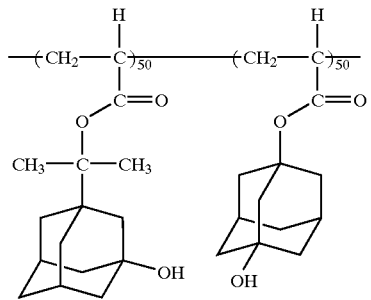

In an Erlenmeyer flask, 5.10 g (19.3 mmole) of the monomer [1-2] (acrylate), 4.33 g (19.3 mmole) of the monomer [2-1] (acrylate), and 0.94 g of an initiator (produced by Wako Pure Chemical Industries, Ltd. under the trade name of "V-65") were placed and were dissolved in 25 g of THF (tetrahydrofuran) to yield a monomer solution.

Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7. 91 g of a target resin. The recovered polymer was subjected to gel permeation chromatographic analysis to find that the polymer had Mw of 8900 and a molecular weight distribution (Mw/Mn) of 2.28. In $^1$H-NMR (in DMSO-$d_6$) spectrum, signals were observed at 0.8–2.4 (broad), 1.6, 1.9, 2.1, and 4.6 ppm.

EXAMPLE 11

Synthesis of Resin Having the Following Structure

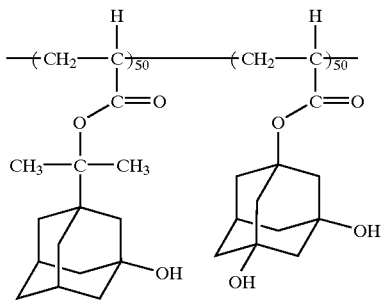

In an Erlenmeyer flask, 5.05 g (18.2 mmole) of the monomer [1-2] (methacrylate), 4.58 g (18.2 mmole) of the monomer [2-2] (methacrylate), and 0.96 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.04 g of a target resin. The recovered polymer was subjected to gel permeation chromatographic analysis to find that the polymer had Mw of 8300 and a molecular weight distribution (Mw/Mn) of 2.18. In $^1$H-NMR (in DMSO-$d_6$) spectrum, signals were observed at 0.8–2.5 (broad), 1.6, 1.9, 2.1, and 4.6 ppm.

EXAMPLE 12

Synthesis of Resin Having the Following Structure

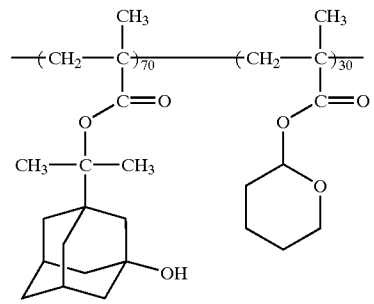

In an Erlenmeyer flask, 8.03 g (28.9 mmole) of the monomer [1-2] (methacrylate), 2.28 g (12.4 mmole) of the monomer [6-1] (methacrylate), and 1.03 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.11 g of a target resin. The recovered polymer was subjected to gel permeation chromatographic analysis to find that the polymer had Mw of 8700 and a molecular weight distribution (Mw/Mn) of 2.31. In $^1$H-NMR (in DMSO-$d_6$) spectrum, signals were observed at 0.8–2.5 (broad), 1.5, 1.9, 2.1, and 4.6 ppm.

EXAMPLE 13

Synthesis of Resin Having the Following Structure

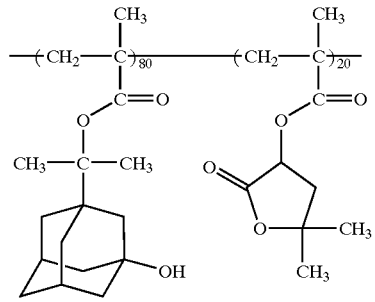

In an Erlenmeyer flask, 8.01 g (28.8 mmole) of the monomer [1-2] (methacrylate), 1.43 g (7.20 mmole) of the monomer [5-3] (methacrylate), and 0.94 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.68 g of a target resin. The recovered polymer was subjected to gel permeation chromatographic analysis to find that the polymer had Mw of 8500 and a molecular weight distribution (Mw/Mn) of 2.21. In $^1$H-NMR (in DMSO-$d_6$) spectrum, signals were observed at 0.8–2.5 (broad), 1.5, 1.9, 2.1, 4.6, and 5.3 ppm.

EXAMPLE 14

Synthesis of Resin Having the Following Structure

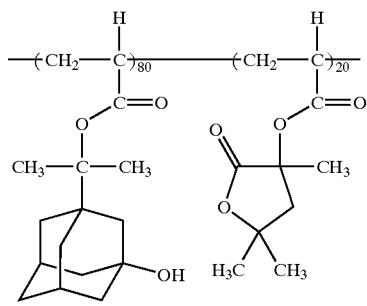

In an Erlenmeyer flask, 8.50 g (32.2 mmole) of the monomer [1-2] (acrylate), 1.51 g (8.1 mmole) of the monomer [5-4] (acrylate), and 1.00 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.24 g of a target resin. The recovered polymer was subjected to gel permeation chromatographic analysis to find that the polymer had Mw of 8700 and a molecular weight distribution (Mw/Mn) of 2.38. In $^1$H-NMR (in DMSO-$d_6$) spectrum, signals were observed at 0.8–2.5 (broad), 1.5, 1.9, 2.1, and 4.6 ppm.

EXAMPLE 15

Synthesis of Resin Having the Following Structure

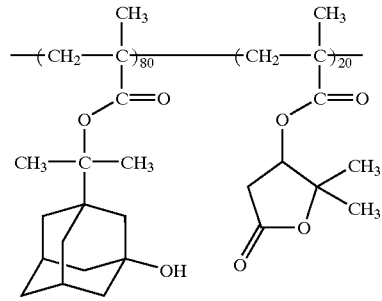

In an Erlenmeyer flask, 8.50 g (30.8 mmole) of the monomer [1-2] (methacrylate), 1.50 g (7.6 mmole) of the monomer [5-15] (methacrylate), and 1.00 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.24 g of a target resin. The recovered polymer was subjected to gel permeation chromatographic analysis to find that the polymer had Mw of 8700 and a molecular weight distribution (Mw/Mn) of 2.38. In $^1$H-NMR (in DMSO-$d_6$) spectrum, signals were observed at 0.8–2.5 (broad), 1.5, 1.9, 2.1, 4.3, 4.6, and 5.3 ppm.

EXAMPLE 16

Synthesis of Resin Having the Following Structure

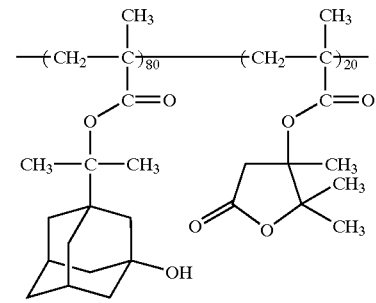

In an Erlenmeyer flask, 8.40 g (30.2 mmole) of the monomer [1-2] (methacrylate), 1.60 g (7.6 mmole) of the monomer [5-16] (methacrylate), and 1.00 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.64 g of a target resin. The recovered polymer was subjected to gel permeation chromatographic analysis to find that the polymer had Mw of 8200 and a molecular weight distribution (Mw/Mn) of 2.29. In $^1$H-NMR (in DMSO-$d_6$) spectrum, signals were observed at 0.8–2.5 (broad), 1.6, 1.9, 2.1, 4.3, and 4.6 ppm.

EXAMPLE 17

Synthesis of Resin Having the Following Structure

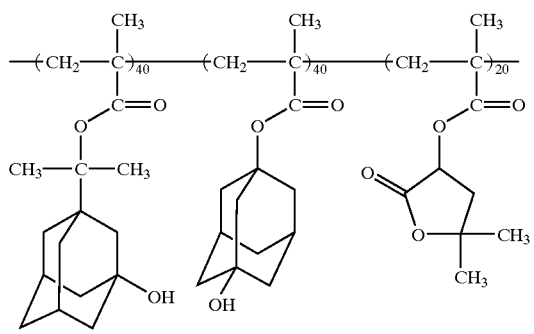

In an Erlenmeyer flask, 4.55 g (16.4 mmole) of the monomer [1-2] (methacrylate), 3.86 g (16.4 mmole) of the monomer [2-1] (methacrylate), 1.62 g (8.2 mmole) of the monomer [5-3] (methacrylate), and 1.01 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with are flux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.18 g of a target resin. The recovered polymer was subjected to gel permeation chromatographic analysis to find that the polymer had Mw of 8100 and a molecular weight distribution (Mw/Mn) of 2.07. In $^1$H-NMR (in DMSO-$d_6$) spectrum, signals were observed at 0.8–2.5 (broad), 1.5, 1.9, 2.1, 4.6, and 5.3 ppm.

EXAMPLE 18

Synthesis of Resin Having the Following Structure

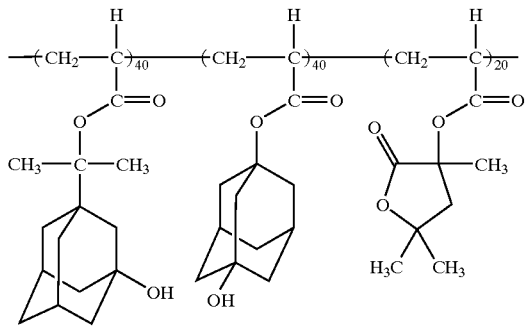

In an Erlenmeyer flask, 4.54 g (17.2 mmole) of the monomer [1-2] (acrylate), 3.83 g (17.2 mmole) of the monomer [2-1] (acrylate), 1.62 g (8.6 mmole) of the monomer [5-4] (acrylate), and 1.00 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.99 g of a target resin. The recovered polymer was subjected to gel permeation chromatographic analysis to find that the polymer had Mw of 8100 and a molecular weight distribution (Mw/Mn) of 2.07. In $^1$H-NMR (in DMSO-$d_6$) spectrum, signals were observed at 0.8–2.5 (broad), 1.6, 1.9, 2.1, and 4.6 ppm.

EXAMPLE 19

Synthesis of Resin Having the Following Structure

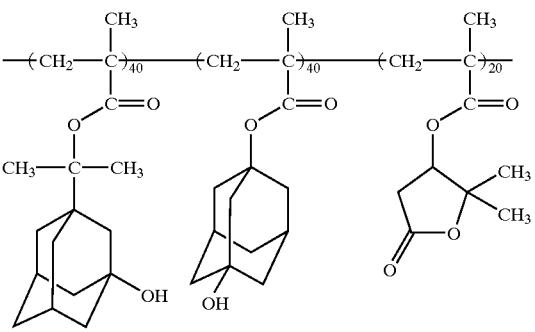

In an Erlenmeyer flask, 4.54 g (16.4 mmole) of the monomer [1-2] (methacrylate), 3.83 g (16.2 mmole) of the monomer [2-1] (methacrylate), 1.81 g (8.2 mmole) of the monomer [5-15] (methacrylate), and 1.02 g of an initiator (produced by Wako Pure Chemical Industries, Ltd. under the trade name of "V-65") were placed and were dissolved in 25 g of THF (tetrahydrofuran) to yield a monomer solution.

Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 8.29 g of a target resin. The recovered polymer was subjected to gel permeation chromatographic analysis to find that the polymer had Mw of 8700 and a molecular weight distribution (Mw/Mn) of 2.02. In $^1$H-NMR (in DMSO-d$_6$) spectrum, signals were observed at 0.8–2.5 (broad), 1.5, 1.9, 2.1, 4.3, and 5.3 ppm.

EXAMPLE 20

Synthesis of Resin Having the Following Structure

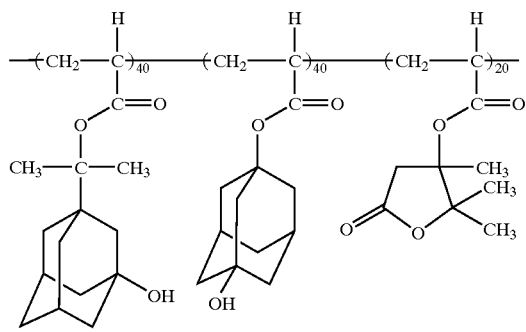

In an Erlenmeyer flask, 4.76 g (18.0 mmole) of the monomer [1-2] (acrylate), 4.04 g (18.0 mmole) of the monomer [2-1] (acrylate), 1.81 g (9.0 mmole) of the monomer [5-16] (acrylate), and 1.06 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.99 g of a target resin. The recovered polymer was subjected to gel permeation chromatographic analysis to find that the polymer had Mw of 8100 and a molecular weight distribution (Mw/Mn) of 2.07. In $^1$H-NMR (in DMSO-d6) spectrum, signals were observed at 0.8–2.5 (broad), 1.6, 1.9, 2.1, and 4.6 ppm.

EXAMPLE 21

Synthesis of Resin Having the Following Structure

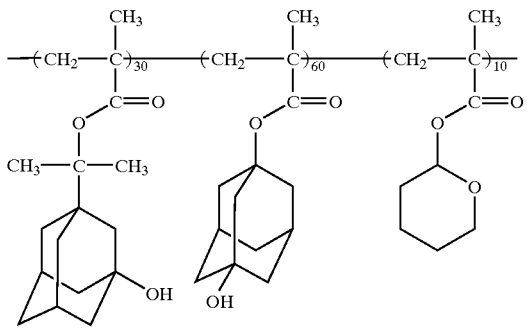

In an Erlenmeyer flask, 3.54 g (12.7 mmole) of the monomer [1-2] (methacrylate), 6.01 g (25.5 mmole) of the monomer [2-1] (methacrylate), 0.78 g (8.2 mmole) of the monomer [6-1] (methacrylate), and 1.03 g of an initiator (produced by Wako Pure Chemical Industries, Ltd. under the trade name of "V-65") were placed and were dissolved in 25 g of THF (tetrahydrofuran) to yield a monomer solution. Separately, 15 g of THF was placed in a 100-ml flask with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining a temperature at 60° C., the reaction mixture was put into 500 ml of hexane, and the formed precipitation was separated by filtration. The precipitation and purification procedure was repeated once again to yield 7.63 g of a target resin. The recovered polymer was subjected to gel permeation chromatographic analysis to find that the polymer had Mw of 8400 and a molecular weight distribution (Mw/Mn) of 2.28. In $^1$H-NMR (in DMSO-d$_6$) spectrum, signals were observed at 0.8–2.5 (broad), 1.5, 1.9, 2.1, 3.6, 3.9, 4.6, and 5.9 ppm.

TEST EXAMPLE

A series of photoresist resin compositions each having a polymer concentration of 17% by weight were prepared by mixing 100 parts by weight of each of the polymers obtained in the examples, 10 parts by weight of triphenylsulfonium hexafluoroantimonate, and ethyl lactate as a solvent. The photoresist resin composition was applied onto a silicon wafer by spin coating to yield a photosensitive layer having a thickness of 1.0 μm. The photosensitive layer was subjected to prebaking on a hot plate at a temperature of 100° C. for 150 seconds, and was exposed to light through a mask using KrF excimer laser 247 nm in wavelength at an irradiance of 30 mJ/cm$^2$. The exposed layer was then subjected to post-exposure baking at a temperature of 100° C. for 60 seconds; was subjected to development in a 0.3 M aqueous tetramethylammonium hydroxide solution for 60 seconds; and was rinsed with pure water to yield a pattern with a 0.25-μm line and space in each case.

Other embodiments and variations will be obvious to those skilled in the art, and this invention is not to be limited to the specific matters stated above.

What is claimed is:

1. A polymeric compound comprising at least one monomeric unit represented by the following formula (I):

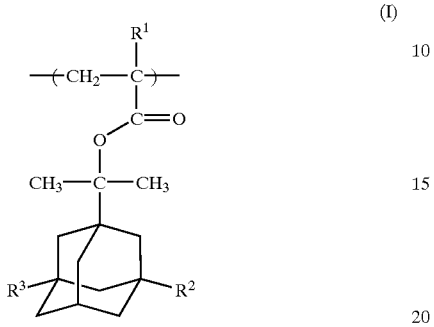

wherein $R^1$ is a hydrogen atom or a methyl group; and each of $R^2$ and $R^3$ is independently a hydrogen atom or a hydroxyl group, and at least one monomeric unit selected from monomeric units represented by the following formulae (IIa) and (IIb):

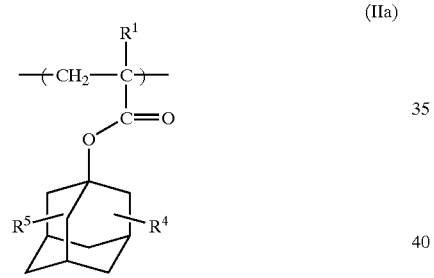

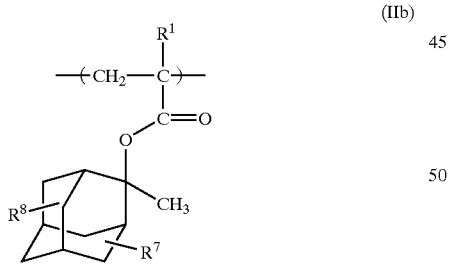

wherein $R^1$ is a hydrogen atom or a methyl group; each of $R^4$ and $R^5$ is independently a hydrogen atom, a hydroxyl group, a carboxyl group, or a —COOR$^6$ group, wherein $R^6$ is a t-butyl group, a 2-tetrahydrofuranyl group, a 2-tetrahydropyranyl group or an 2-oxepanyl group, and wherein $R^4$ and $R^5$ are not concurrently hydrogen atoms; and each of $R^7$ and $R^8$ is independently a hydrogen atom, a hydroxyl group, or an oxo group.

2. A polymeric compound comprising at least one monomeric unit represented by the following formula (I):

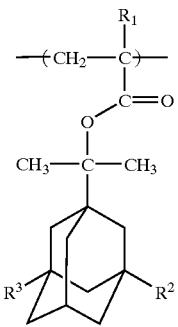

wherein $R^1$ is a hydrogen atom or a methyl group; and each of $R^2$ and $R^3$ is independently a hydrogen atom or a hydroxyl group; and at least one monomeric unit selected from the group consisting of:

a monomeric unit represented by the following formula (III):

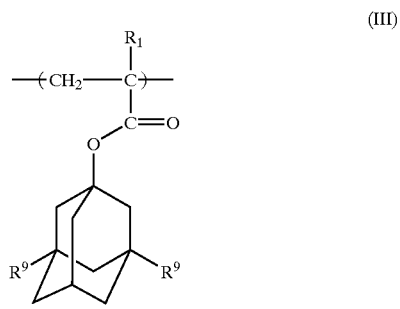

wherein each of $R^1$ and $R^9$ is independently a hydrogen atom or a methyl group;

a monomeric unit represented by the following formula (IV):

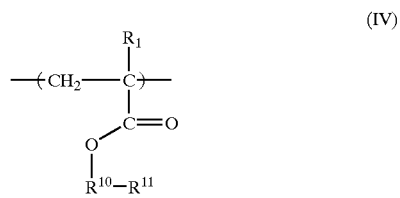

wherein $R^{10}$ is a tricyclo [5.2.1.0$^{2,6}$] decylmethyl group, a tetracyclo[4.4.0.1$^{2,5}$.1$^{7,10}$] dodecylmethyl group, a norbornyl group, an isobornyl group, or a 2-norbornylmethyl group, $R^{11}$ is a substituent of $R^{10}$ selected from the group consisting of a hydrogen atom, a hydroxyl group, a hydroxymethyl group, a carboxyl group, and a —COOR$^{12}$ group, wherein $R^{12}$ is a t-butyl group, a 2-tetrahydrofuranyl group, a 2-tetrahydropyranyl group, or an 2-oxepanyl group; and $R^1$ has the same meaning as defined above; a monomeric unit represented by the following formula (Va) or (Vb):

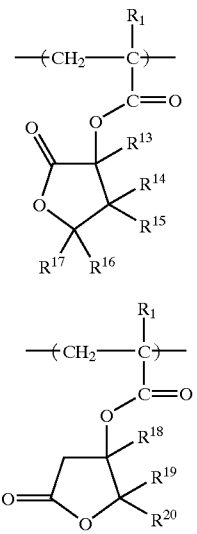

(Va)

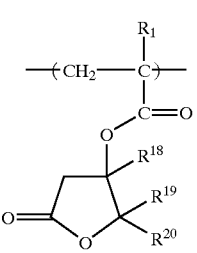

(Vb)

wherein each of $R^{13}$, $R^{14}$, $R^{15}$, $R^{16}$, $R^{17}$, $R^{18}$, $R^{19}$, and $R^{20}$ is independently a hydrogen atom or a methyl group, and $R^1$ has the same meaning as defined above; and a monomeric unit represented by the following formula (VI):

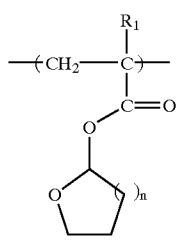

(VI)

wherein n denotes an integer of 1 to 3; and $R^1$ has the same meaning as defined above; and a monomeric unit represented by the following formula (VII):

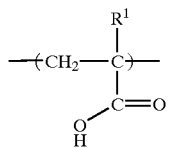

(VII)

wherein $R^1$ has the same meaning as defined above.

3. A polymeric compound according to claim 1 or 2, wherein monomeric units each having an adamantane skeleton occupy 0% to 100% by weight of overall monomeric units constituting the polymer.

4. A polymeric compound according to claim 1 or 2, wherein monomeric units each having an adamantane skeleton occupy 70% to 100% by weight of overall monomeric units constituting the polymer.

5. A photoresist resin composition comprising the polymeric compound of claim 1 or 2 and a light-activatable acid generator.

6. A polymeric compound according to claim 1, further comprising at least one monomeric unit selected from the group consisting of:

a monomeric unit represented by the following formula (III):

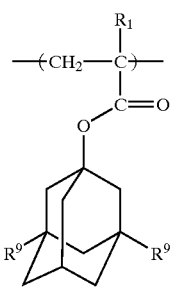

(III)

wherein each of $R^1$ and $R^9$ is independently a hydrogen atom or a methyl group;

a monomeric unit represented by the following formula (IV):

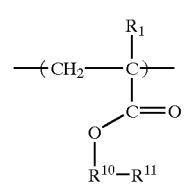

(IV)

wherein $R^{10}$ is a tricyclo[5.2.1.0$^{2,6}$]decylmethyl group, a tetracyclo [4.4.0.1$^{2,5}$.1$^{7,10}$]dodecylmethyl group, a norbornyl group, an isobornyl group, or a 2-norbornylmethyl group, $R^{11}$ is a substituent of $R^{10}$ selected from the group consisting of a hydrogen atom, a hydroxyl group, a hydroxymethyl group, a carboxyl group, and a —COOR$^{12}$ group, wherein $R^{12}$ is a t-butyl group, a 2-tetrahydrofuranyl group, a 2-tetrahydropyranyl group, or a 2-oxepanyl group; and $R^1$ has the same meaning as defined above;

a monomeric unit represented by the following formula (Va) or (Vb):

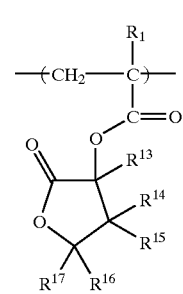

(Va)

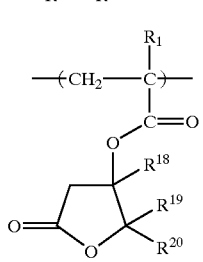

(Vb)

wherein each of $R^{13}$, $R^{14}$, $R^{15}$, $R^{16}$, $R^{17}$, $R^{18}$, $R^{19}$ and $R^{20}$ is independently a hydrogen atom or a methyl group, and $R^1$ has the same meaning as defined above;

a monomeric unit represented by the following formula (VI):

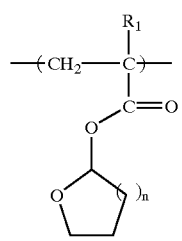
(VI)

wherein n denotes an integer of 1 to 3; and $R^1$ has the same meaning as defined above; and a monomeric unit represented by the following formula (VII):

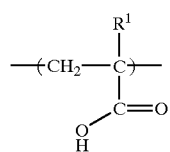
(VII)

wherein $R^1$ has the same meaning as defined above.

7. A polymeric compound according to claim 2, further comprising:
at least one monomeric unit selected from monomeric units represented by the following formulae (IIa) and (IIb):

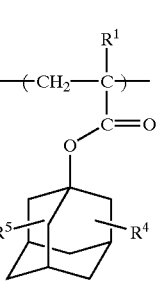
(IIa)

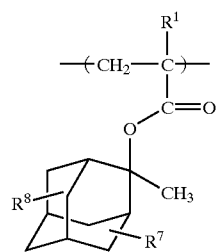
(IIb)

wherein $R^1$ is a hydrogen atom or a methyl group; each of $R^4$ and $R^5$ is independently a hydrogen atom, a hydroxyl group, an oxo group, a carboxyl group, or a —COOR$^6$ group, wherein $R^6$ is a t-butyl group, a 2-tetrahydrofuranyl group, a 2-tetrahydropyranyl group or a 2-oxepanyl group, and wherein $R^4$ and $R^5$ are not concurrently hydrogen atoms; and each of $R^7$ and $R^8$ is independently a hydrogen atom, a hydroxyl group, or an oxo group.

* * * * *